(12) United States Patent
Lee et al.

(10) Patent No.: US 11,328,665 B2
(45) Date of Patent: May 10, 2022

(54) PIXEL AND DISPLAY DEVICE INCLUDING THE SAME

(71) Applicant: Samsung Display Co., Ltd., Yongin-si (KR)

(72) Inventors: Jeongsoo Lee, Yongin-si (KR); Kyunghyun Baek, Yongin-si (KR); Sewan Son, Yongin-si (KR); Yoonjong Cho, Yongin-si (KR); Moosoon Ko, Yongin-si (KR); Yeonha Baek, Yongin-si (KR); Seokje Seong, Yongin-si (KR); Jinsung An, Yongin-si (KR); Inhyuck Yeo, Yongin-si (KR); Seongjun Lee, Yongin-si (KR); Jaehyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/110,725

(22) Filed: Dec. 3, 2020

(65) Prior Publication Data

US 2021/0241689 A1 Aug. 5, 2021

(30) Foreign Application Priority Data

Feb. 4, 2020 (KR) .......................... 10-2020-0013298

(51) Int. Cl.
   *G09G 3/3233* (2016.01)
   *G09G 3/3266* (2016.01)
   *G09G 3/3275* (2016.01)

(52) U.S. Cl.
   CPC ......... *G09G 3/3233* (2013.01); *G09G 3/3266* (2013.01); *G09G 3/3275* (2013.01); *G09G 2300/0426* (2013.01)

(58) Field of Classification Search
   CPC .................................................... H01L 27/124
   See application file for complete search history.

(56) References Cited

U.S. PATENT DOCUMENTS 9,583,633 B2  2/2017 Ahn et al.
9,614,020 B2  4/2017 Yang et al.
(Continued)

FOREIGN PATENT DOCUMENTS

KR   10-2015-0127652 A   11/2015
KR   10-2016-0089592 A    7/2016
(Continued)

*Primary Examiner* — Nitin Patel
*Assistant Examiner* — Amen W Bogale
(74) *Attorney, Agent, or Firm* — Lewis Roca Rothgerber Christie LLP

(57) ABSTRACT

A pixel including: a light-emitting diode; a first PMOS transistor including a first electrode connected to a node and a second electrode transmitting a driving current to the light-emitting diode; a second transistor connected between a data line and the node and turned on by a first scan signal; a third NMOS transistor connected between a gate electrode and the second electrode of the first transistor and turned on by a first emission control signal; a fourth NMOS transistor connected between the gate electrode of the first transistor and a first initialization voltage line and turned on by a second emission control signal; a fifth transistor connected between a driving voltage line and the node and turned on by the first emission control signal; and a sixth transistor connected between the second electrode of the first transistor and the light-emitting diode and turned on by the first emission control signal.

20 Claims, 18 Drawing Sheets

(56) References Cited

U.S. PATENT DOCUMENTS

| | | | |
|---|---|---|---|
| 2012/0001896 A1* | 1/2012 | Han | G09G 3/3233 |
| | | | 345/214 |
| 2017/0110528 A1* | 4/2017 | Kim | H01L 27/124 |
| 2018/0061915 A1* | 3/2018 | Yu | H01L 27/3262 |
| 2018/0175178 A1 | 6/2018 | Jo et al. | |
| 2019/0088209 A1 | 3/2019 | Kang et al. | |
| 2019/0096330 A1 | 3/2019 | Kim et al. | |
| 2019/0131376 A1* | 5/2019 | Hong | G09G 3/3266 |
| 2019/0172395 A1* | 6/2019 | Yuan | G09G 3/3291 |
| 2019/0363148 A1 | 11/2019 | Ka et al. | |
| 2020/0388214 A1* | 12/2020 | Yang | G09G 3/3233 |
| 2021/0082339 A1* | 3/2021 | Zhang | G09G 3/3233 |
| 2021/0193046 A1* | 6/2021 | Wang | G09G 3/3291 |

FOREIGN PATENT DOCUMENTS

| | | |
|---|---|---|
| KR | 10-2016-0104772 A | 9/2016 |
| KR | 10-2017-0080796 A | 7/2017 |
| KR | 10-2018-0004369 A | 1/2018 |
| KR | 10-2019-0031403 A | 3/2019 |
| KR | 10-2019-0034375 A | 4/2019 |

* cited by examiner

PIXEL AND DISPLAY DEVICE INCLUDING THE SAME

CROSS-REFERENCE TO RELATED APPLICATION

This application claims priority to and the benefit of Korean Patent Application No. 10-2020-0013298, filed on Feb. 4, 2020, in the Korean Intellectual Property Office, the disclosure of which is incorporated herein in its entirety by reference.

BACKGROUND

1. Field

Aspects of embodiments relate to a pixel and a display device including the pixel.

2. Description of Related Art

In general, a display device may include a display element and a driving circuit for controlling electrical signals applied to the display element. A driving circuit may include a thin film transistor (TFT), a storage capacitor, and a plurality of wiring lines.

To accurately control the emission (e.g., an emission degree) of the display element, the number of thin film transistors electrically connected to a single display element has been increased. Accordingly, studies to solve issues regarding high integration complexity and power consumption of a display device have been actively performed.

SUMMARY

One or more embodiments provide a display device that is driven by a thin film transistor including a silicon semiconductor and a thin film transistor including an oxide semiconductor and which provides reduced power consumption and a high degree of integration. However, the above described aspects and features of embodiments are merely examples, and the scope of the disclosure is not limited thereby.

Additional features and aspects will be set forth, in part, in the description which follows and, in part, will be apparent from the description or may be learned by practice of the example embodiments described in the disclosure.

According to an embodiment, a pixel includes a light-emitting diode, a first transistor including a gate electrode, a first electrode connected to a node, and a second electrode connected to the light-emitting diode and transmitting a driving current to the light-emitting diode, a second transistor connected between a data line and the node and turned on by a first scan signal, a third transistor connected between the gate electrode and the second electrode of the first transistor and turned on by a first emission control signal, a fourth transistor connected between the gate electrode of the first transistor and a first initialization voltage line and turned on by a second emission control signal, a fifth transistor connected between a driving voltage line and the node and turned on by the first emission control signal, and a sixth transistor connected between the second electrode of the first transistor and the light-emitting diode and turned on by the first emission control signal. The first transistor includes a PMOS transistor, and the third transistor and the fourth transistor each includes an NMOS transistor.

The PMOS transistor may include a silicon semiconductor, and the NMOS transistors may include an oxide semiconductor.

The pixel may further include a first capacitor connected between the driving voltage line and the gate electrode of the first transistor, and a second capacitor connected between the gate electrode of the first transistor and a gate electrode of the second transistor.

The second emission control signal may be output before the first emission control signal.

The pixel may further include a first scan line connected to a gate electrode of the second transistor, a second scan line connected to a gate electrode of the fourth transistor, and an emission control line connected to gate electrodes of the third transistor, the fifth transistor, and the sixth transistor.

The pixel may further include a first scan line connected to a gate electrode of the second transistor, a second scan line connected to a gate electrode of the fourth transistor, a third scan line connected to a gate electrode of the third transistor, and an emission control line connected to gate electrodes of the fifth transistor and the sixth transistor. The third scan line may be a branch line of the emission control line.

The pixel may further include a seventh transistor connected between the light-emitting diode and a second initialization voltage line and turned on by a second scan signal.

The second scan signal may be output before the first scan signal or output after the first scan signal.

The second transistor, the fifth transistor, the sixth transistor, and the seventh transistor may each include a PMOS transistor including a silicon semiconductor.

According to an embodiment, a display device includes a plurality of pixels, a scan driving circuit configured to supply scan signals to the plurality of pixels, an emission control driving circuit configured to supply emission control signals to the plurality of pixels, and a data driving circuit configured to supply data signals to the plurality of pixels. Each of the plurality of pixels includes a light-emitting diode, a first transistor including a gate electrode, a first electrode connected to a node, and a second electrode connected to the light-emitting diode, and transmitting a driving current to the light-emitting diode, a second transistor connected between a data line and the node and turned on by a first scan signal, a third transistor connected between the gate electrode and the second electrode of the first transistor and turned on by a first emission control signal, a fourth transistor connected between the gate electrode of the first transistor and a first initialization voltage line and turned on by a second emission control signal, a fifth transistor connected between a driving voltage line and the node and turned on by the first emission control signal, and a sixth transistor connected between the second electrode of the first transistor and the light-emitting diode and turned on by the first emission control signal. The first transistor includes a PMOS transistor, and the third transistor and the fourth transistor each includes an NMOS transistor.

The PMOS transistor may include a silicon semiconductor, and the NMOS transistors may include an oxide semiconductor.

Each of the plurality of pixels may include a first capacitor connected between the driving voltage line and the gate electrode of the first transistor and a second capacitor connected between the gate electrode of the first transistor and a gate electrode of the second transistor.

The emission control driving circuit may sequentially output the emission control signals shifted by an interval, and the second emission control signal may be output before the first emission control signal.

Each of the plurality of pixels may further include a first scan line connected to a gate electrode of the second transistor, a second scan line connected to a gate electrode of the fourth transistor, and an emission control line connected to gate electrodes of the third transistor, the fifth transistor, and the sixth transistor. The scan driving circuit may be connected to the first scan line, and the emission control driving circuit may be connected to the second scan line and the emission control line.

Each of the plurality of pixels may further include a first scan line connected to a gate electrode of the second transistor, a second scan line connected to a gate electrode of the fourth transistor, a third scan line connected to a gate electrode of the third transistor, and an emission control line connected to gate electrodes of the fifth transistor and the sixth transistor. The third scan line may be a branch line of the emission control line, the scan driving circuit may be connected to the first scan line, and the emission control driving circuit may be connected to the second scan line and the emission control line.

Each of the plurality of pixels may further include a seventh transistor connected between the light-emitting diode and a second initialization voltage line and turned on by a second scan signal supplied via a fourth scan line connected to the gate electrode of the seventh transistor.

The scan driving circuit may sequentially output the scan signals shifted by an interval, and the second scan signal may be output before the first scan signal or output after the first scan signal.

The second transistor, the fifth transistor, the sixth transistor, and the seventh transistor each may include a PMOS transistor including a silicon semiconductor.

Each of the third transistor and the fourth transistor may include a lower gate electrode and an upper gate electrode.

The lower gate electrode of the third transistor and the lower gate electrode of the fourth transistor may be on different layers.

BRIEF DESCRIPTION OF THE DRAWINGS

The above and other aspects and features of embodiments of the disclosure will be more apparent from the following description taken in conjunction with the accompanying drawings, in which.

DETAILED DESCRIPTION

Figure 1:
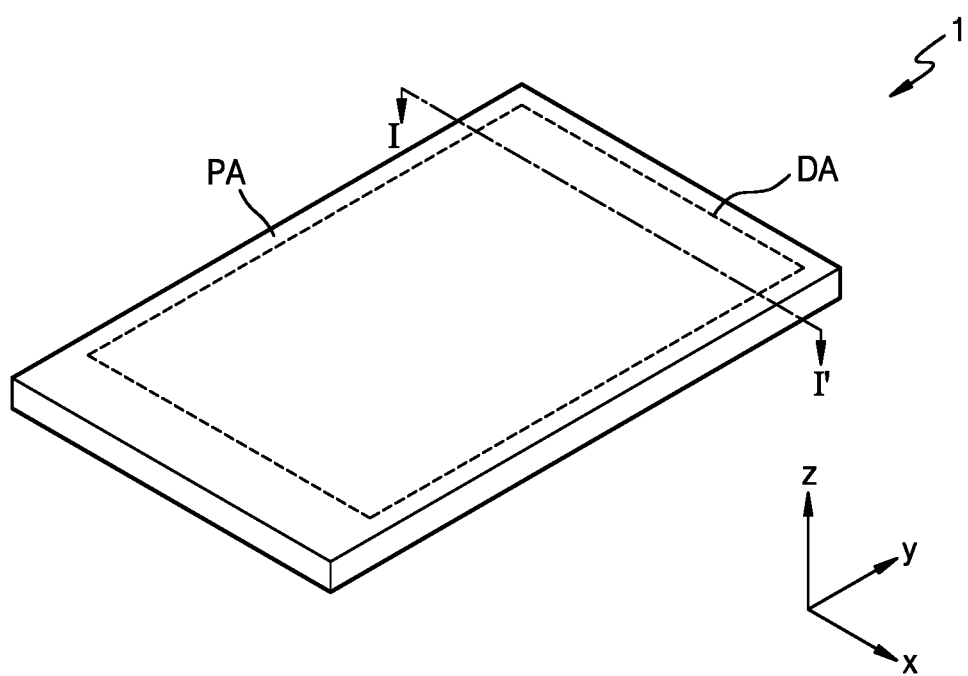
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the illustrated embodiments may have different forms and should not be construed as being limited to the descriptions set forth herein. Accordingly, example embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, and variations thereof.

It will be understood that although the terms "first," "second," etc. may be used herein to describe various elements, these elements should not be limited by these terms. These elements are only used to distinguish one element from another.

As used herein, the singular forms "a" and "an" are intended to include the plural forms as well, unless the context clearly indicates otherwise.

It will be further understood that the terms "includes," "including," has," "having," "comprises," and/or "comprising" are used herein to specify the presence of stated features or elements but do not preclude the presence or addition of one or more other features or elements.

It will be understood that when a layer, region, or element is referred to as being "on" or "formed on" another layer, region, or element, it can be directly or indirectly on or formed on the other layer, region, or element. For example, intervening layers, regions, or elements may also be present.

Sizes of elements in the drawings may be exaggerated for convenience of explanation. In other words, sizes and thicknesses of elements shown in the drawings may be arbitrarily illustrated for convenience of explanation, and the following embodiments are not limited thereto.

Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

In the following embodiments, the expression that a wiring "extends in a first direction or a second direction" may include extending not only in a linear direction (e.g., not only having a linear shape) but also in a zigzag or curved direction (e.g., having a zigzag or curved shape) in the first direction or the second direction.

In the following embodiments, the expression "on a plane" may signify a plane of an object as seen from the top, and the expression "in a section" may signify a plane of an object as seen from the side thereof when the object is cut vertically. In the following embodiments, when a first element "overlaps" with a second element, the first element may be located above or below the second element.

In the following embodiments, the term "ON" used in association with the state of a device may refer to an activated state of the device, and the term "OFF" may refer to an inactive state of the device. The term "ON" used in association with a signal received by a device may refer to a signal that activates the device, and the term "OFF" may refer to a signal that deactivates the device. A device may be activated by a high-level voltage or a low-level voltage. For example, a P-channel transistor may be activated by a low-level voltage, and an N-channel transistor may be activated by a high-level voltage. Accordingly, an "ON" voltage to the P-channel transistor may be understood to be a voltage of an opposite level as an "ON" voltage to the N-channel transistor (e.g., low to high).

Figure 2:
FIG. 2 is a schematic cross-sectional view taken along the line I-I' of FIG. 1.

FIG. 1 is a schematic perspective view of a display device 1 according to an embodiment, and FIG. 2 is a schematic cross-sectional view of the display device 1 shown in FIG. 1 and may correspond to a cross-section taken along the line I-I' of FIG. 1.

A display device according to embodiments may be implemented by (e.g., may be included in) an electronic device, such as smart phones, cell phones, smart watches, navigation devices, game consoles, TVs, car head units, notebook computers, laptop computers, tablet computers, personal media players (PMPs), personal digital assistants (PDAs), etc. Furthermore, an electronic device may be a flexible device.

The display device 1 may have a display area DA for displaying an image and a peripheral area PA disposed around the display area DA. The display device 1 may provide an image by using light emitted from a plurality of pixels disposed in the display area DA.

The display device 1 may have various shapes, for example, in a rectangular plate shape having two sides that are parallel to each other. When the display device 1 has the rectangular plate shape, any one pair of two pairs of sides may be longer than the other pair of the two pairs of sides. In an embodiment, for convenience of explanation, a display device has a rectangular shape having a pair of long sides and a pair of short sides, in which an extension direction of the short sides is a first direction (e.g., the x direction), an extension direction of the long sides is a second direction (e.g., the y direction), and a direction perpendicular to the extension directions of the long sides and the short sides is a third direction (e.g., the z direction). In another embodiment, the display device 1 may have non-rectangular shape. A non-rectangular shape may include, for example, a circle, an oval, a polygon having a partially circular shape, and a polygon except a rectangle.

When the display area DA is regarded as a plane shape, the display area DA may be a rectangular shape as illustrated in FIG. 1. In another embodiment, the display area DA may be a polygonal shape, such as a triangle, a pentagon, a hexagon, a circular shape, an oval shape, an irregular shape, etc.

The peripheral area PA, which is an area disposed around the display area DA, may be a non-display area in which no pixel is disposed. The display area DA may be entirely surrounded by (e.g., may be entirely surrounded along a periphery thereof by) the peripheral area PA. Various wiring lines for transmitting electrical signals to be applied to the display area DA and pads on which a printed circuit board or a driver IC chip is attached may be located in the peripheral area PA.

In the following description, an organic light-emitting display device is described as an example of the display device 1, but the display device according to the disclosure is not limited thereto. In other embodiments, the display device 1 may be an inorganic light-emitting display device (or inorganic EL display device) or a quantum dot light-emitting display device.

Referring to FIG. 2, the display device 1 may include a display panel 10, an input sensing layer 40 disposed on the display panel 10, and an optical function layer 50, which may be covered by a window 60.

The display panel 10 may display an image. The display panel 10 may include the pixels disposed in the display area DA. The pixels may include a display element. The display element may be connected to a pixel circuit. The display element may include an organic light-emitting diode, a quantum dot organic light-emitting diode, etc.

The input sensing layer 40 obtains coordinate information according to an external input, for example, a touch event. The input sensing layer 40 may include a sensing electrode (e.g., a touch electrode) and trace lines connected to the sensing electrode. The input sensing layer 40 may be disposed on the display panel 10. The input sensing layer 40 may detect an external input in a mutual capacitance method and/or a self-capacitance method.

The input sensing layer 40 may be directly formed on the display panel 10 or may be separately formed and then coupled to the display panel 10 via an adhesive layer, such as an optical clear adhesive. For example, the input sensing layer 40 may be formed (e.g., continuously formed) after a process of forming the display panel 10. In this embodiment, the input sensing layer 40 may be a part of the display panel 10, and an adhesive layer may not be provided between the input sensing layer 40 and the display panel 10. FIG. 2 illustrates the input sensing layer 40 being provided between the display panel 10 and the optical function layer 50. However, in another embodiment, the input sensing layer 40 may be disposed on (e.g., above) the optical function layer 50.

The optical function layer 50 may include an anti-reflection layer. The anti-reflection layer may reduce reflectivity of light (e.g., external light) incident on the display panel 10 from the outside through the window 60. The anti-reflection layer may include a retarder and/or a polarizer. The retarder may be of a film type or a liquid crystal coating type and may include a λ/2 retarder and/or a λ/4 retarder. The polarizer may be of a film type or a liquid crystal coating type. The film type may include a stretched synthetic resin film, and the liquid crystal coating type may include arranged liquid crystals (e.g., liquid crystals arranged in a certain array). The retarder and the polarizer may further include a protection film. The retarder and the polarizer itself or the protection film may be defined as a base layer of the anti-reflection layer.

In another embodiment, the anti-reflection layer may include a black matrix and color filters. The color filters may be arranged considering the color of light to be emitted from each pixel of the display panel 10. In another embodiment, the anti-reflection layer may include a destructive interference structure. The destructive interference structure may include a first reflective layer and a second reflective layer disposed on different layers from each other. First reflection light and second reflection light, which are respectively reflected by the first reflective layer and the second reflective layer, may destructively interfere with each other and, accordingly, reflectivity of external light may be reduced.

The optical function layer 50 may include a lens layer. The lens layer may improve output efficiency of the light emitted from the display panel 10 (e.g., may improve light emission or extraction efficiency of the display panel 10) or reduce color deviation. The lens layer may include a layer having a concave or convex lens shape and/or a plurality of layers having different refractive indexes. The optical function layer 50 may include all of the above-described anti-reflection layer and lens layer or any one thereof.

In an embodiment, the optical function layer 50 may be continuously formed after a process of forming the display panel 10 and/or the input sensing layer 40. In this embodiment, an adhesive layer may not be provided between the optical function layer 50 and the display panel 10 and/or the input sensing layer 40.

Figure 3:
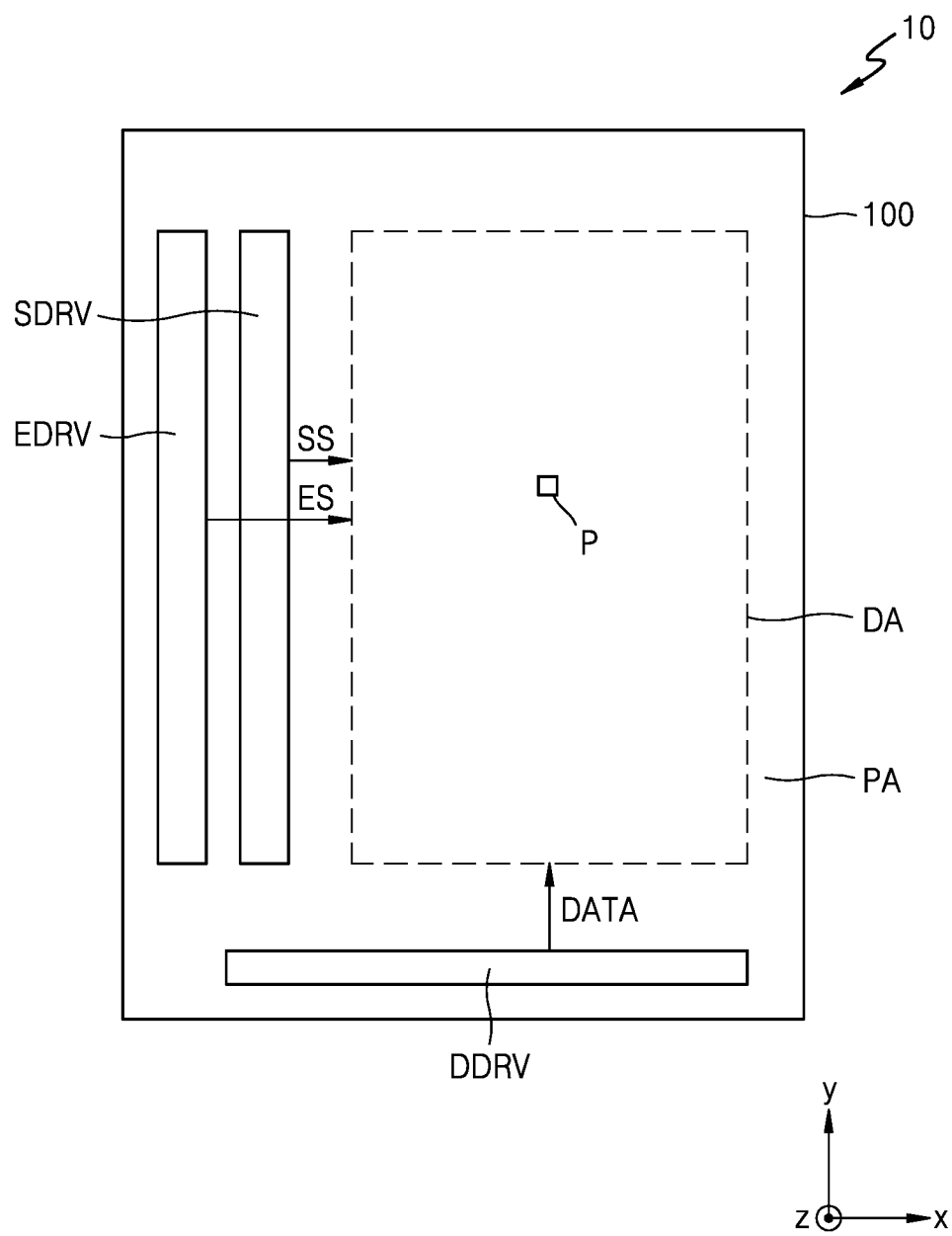
FIG. 3 is a schematic plan view of a display panel according to an embodiment.
Figure 4:
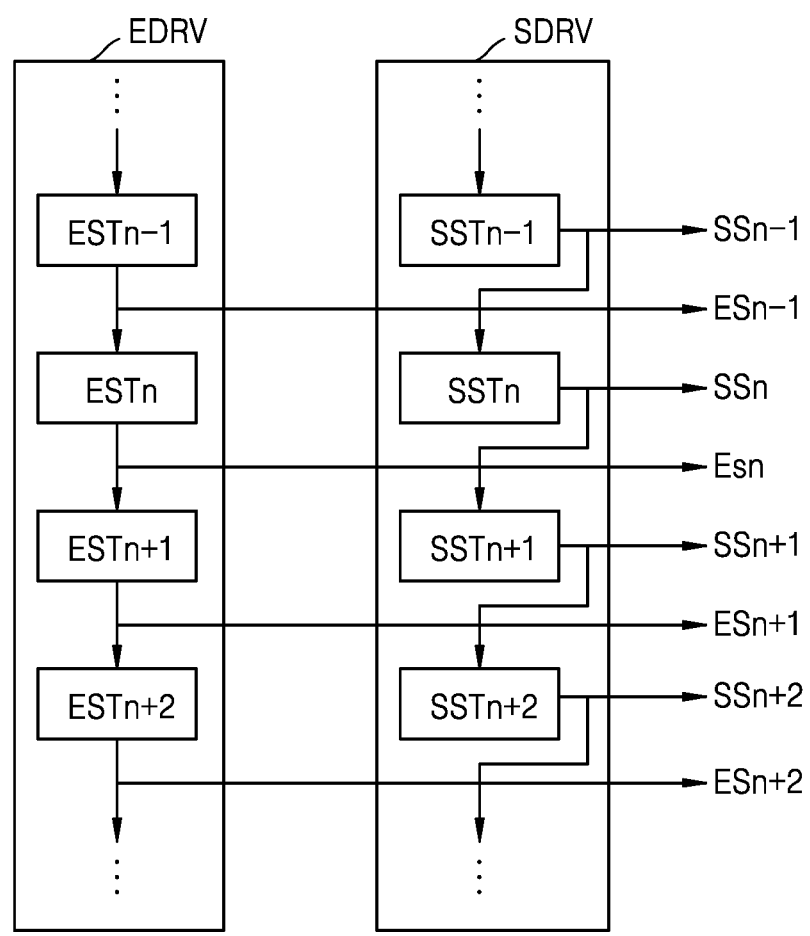
FIG. 4 schematically illustrates a scan driving circuit (SDRV) and an emission control driving circuit (EDRV) shown in FIG. 3.
Figure 5:
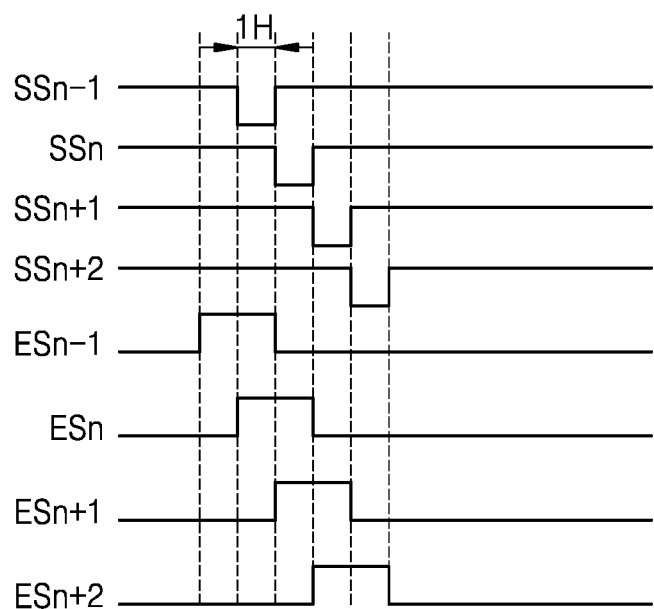
FIG. 5 is a timing diagram of a scan signal and an emission control signal respectively output by the SDRV and the EDRV shown in FIG. 4.

FIG. 3 is a schematic plan view of a display panel according to an embodiment, FIG. 4 schematically illustrates a scan driving circuit (SDRV) and an emission control driving circuit (EDRV) shown in FIG. 3, and FIG. 5 is a timing diagram of a scan signal and an emission control signal respectively output by the SDRV and the EDRV shown in FIG. 4.

Referring to FIG. 3, the display panel 10 may have the display area DA and the peripheral area PA. The display panel may include a substrate 100, and for example, the substrate 100 may have the display area DA and the peripheral area PA.

The substrate 100 may include various suitable materials, such as glass, metal, or plastic. According to an embodiment, the substrate 100 may include (or may be formed of) a flexible material. The substrate 100 including a flexible material may refer to a substrate that is easily bent, folded, or rolled. The substrate 100 including a flexible material may include ultrathin glass, metal, or plastic, as some examples.

Figure 6:
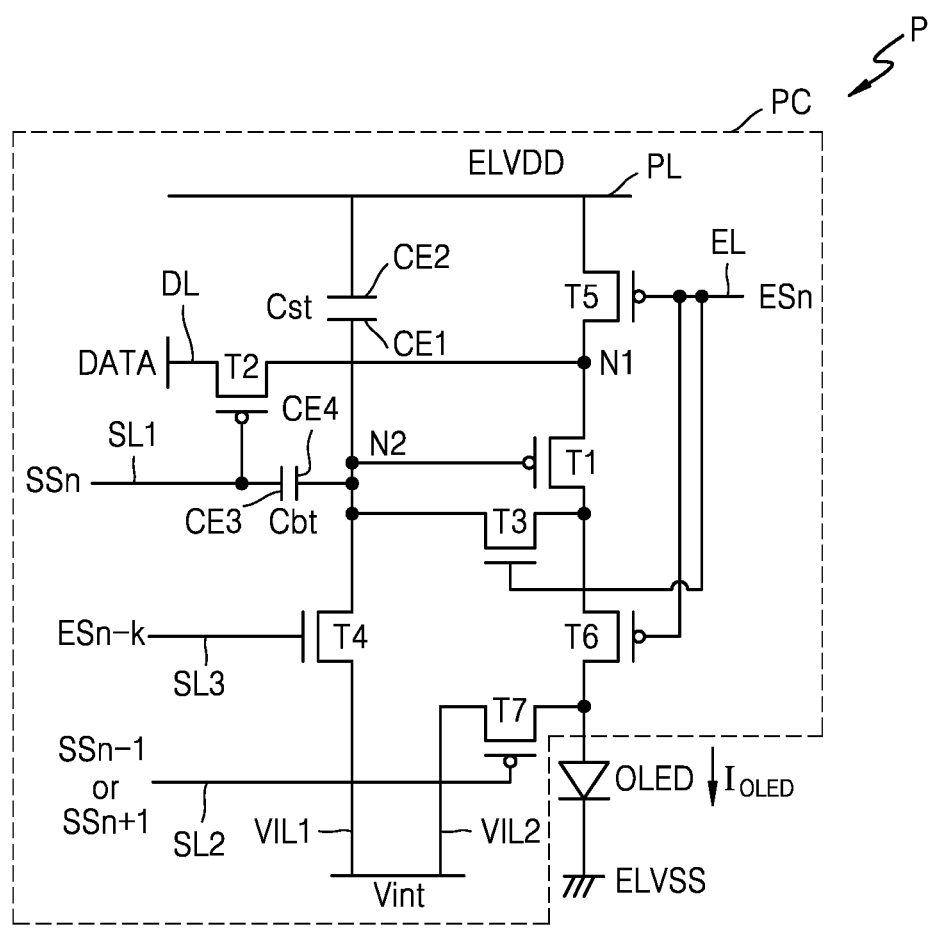
FIG. 6 is an equivalent pixel circuit diagram according to an embodiment.

A plurality of pixels P may be disposed in the display area DA of the display panel 10. The pixels P may be disposed in various forms (e.g., arrangements), such as a stripe matrix, a PenTile® (a registered trademark of Samsung Display Co., Ltd.) matrix, a mosaic matrix, etc. and may implement (e.g., display) an image. According to one embodiment, each pixel P may include, as illustrated in FIG. 6, an organic light-emitting diode (OLED) as a display element, and the OLED may be connected to a pixel circuit (PC). Each pixel P may emit, for example, red, green, blue, or white light via the OLED.

The peripheral area PA of the display panel 10 is disposed outside the display area DA and may be an area where no image is displayed. From among pixel circuits connected to each pixel P, the SDRV for supplying a scan signal SS, the EDRV for supplying an emission control signal ES, a data driving circuit DDRV for supplying a data signal DATA, and main power wiring lines for supplying a driving voltage and a common voltage may be disposed in the peripheral area PA. FIG. 3 illustrates that the data driving circuit DDRV is disposed close to (e.g., adjacent to) one side of the substrate 100. However, according to another embodiment, the data driving circuit DDRV may be disposed on a flexible printed circuit board (FPCB) that is electrically connected to a pad disposed at one side of the display panel 10.

Referring to FIG. 4, the SDRV and the EDRV each may be implemented by (e.g., may each include) a shift register including a plurality of stages.

The SDRV may include a plurality of stages ( . . . , SSTn−1, SSTn, SSTn+1, . . . ) that are dependently (e.g., consecutively) connected to each other. Each of the stages ( . . . , SSTn−1, SSTn, SSTn+1, . . . ) may respectively output a scan signal ( . . . , SSn−1, SSn, SSn+1, . . . ). A first stage of the stages ( . . . , SSTn−1, SSTn, SSTn+1, . . . ) may output a scan signal in response to a start signal, and the other stages except the first stage may receive a carry signal from the previous stage as a start signal. The carry signal may be a scan signal output from a previous stage. Each of the stages ( . . . , SSTn−1, SSTn, SSTn+1, . . . ) may output a scan signal according to a driving timing.

In an embodiment, as illustrated in FIG. 5, the scan signals ( . . . , SSn−1, SSn, SSn+1, . . . ) may each have a low-level signal having a width of 1 horizontal cycle 1H and may be output to be sequentially shifted by 1 horizontal cycle 1H with respect to the prior scan signal.

The EDRV may include a plurality of stages ( . . . , ESTn−1, ESTn, ESTn+1, . . . ) that are dependently (e.g., sequentially) connected to each other. Each of the stages ( . . . , ESTn−1, ESTn, ESTn+1, . . . ) may respectively output an emission control signal ( . . . , ESn−1, ESn, ESn+1, . . . ). A first stage of the stages ( . . . , ESTn−1, ESTn, ESTn+1, . . . ) may output an emission control signal in response to a start signal, and the other stages except the first stage may receive a carry signal from the previous stage as a start signal. The carry signal may be an emission control signal output from a previous stage. Each of the stages ( . . . , ESTn−1, ESTn, ESTn+1, . . . ) may output an emission control signal according to a driving timing. In an embodiment, as illustrated in FIG. 5, the emission control signals ( . . . , ESn−1, ESn, ESn+1, . . . ) may each have a high-level signal having a width of 2 horizontal cycles 2H and may be output to be sequentially shifted by 1 horizontal cycle 1H with respect to the prior emission control signal.

Although FIG. 4 illustrates that the stages of the SDRV and the stages of the EDRV are provided in one to one correspondence to each other (e.g., the SDRV and the EDRV include the same number of stages), this is exemplary, and various modifications are possible such that one stage of the EDRV is provided corresponding to two stages of the SDRV. Furthermore, the width and a degree of the shift of the scan signal SS and the emission control signal ES illustrated in FIG. 5 are exemplary, and various modifications are possible such that the emission control signal ES is output in the form of being sequentially shifted by a ½ horizontal cycle ½H.

Figure 7:
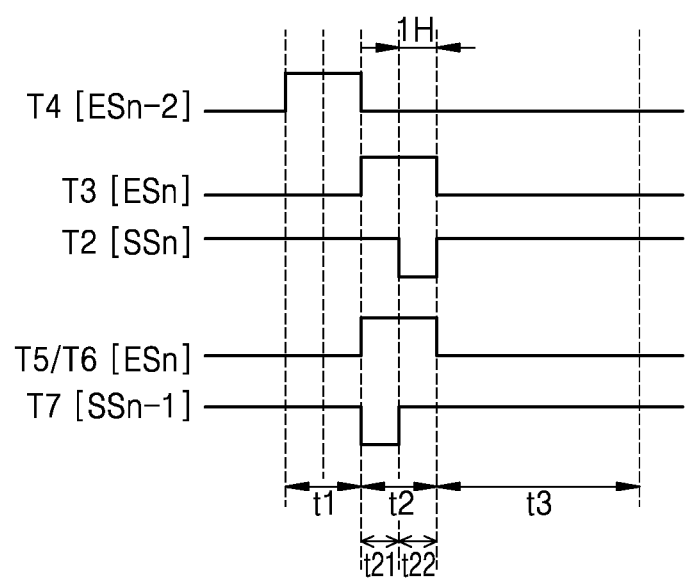
FIG. 7 is a timing diagram of driving of the pixel circuit shown in FIG. 6.

FIG. 6 is an equivalent circuit diagram of a pixel according to an embodiment, and FIG. 7 is a timing diagram of driving of a pixel circuit of FIG. 6.

Referring to FIG. 6, the pixel P may include the OLED as a display element, and the OLED may be connected to the pixel circuit PC. The pixel circuit PC may include a plurality of transistors (e.g., first to seventh transistors T1, T2, T3, T4, T5, T6, and T7), a first capacitor Cst, a second capacitor Cbt and signal lines connected thereto, first and second initialization voltage lines VIL1 and VIL2, and a driving voltage line PL. The signal lines may include a data line DL, a first scan line SL1, a second scan line SL2, a third scan line SL3, and an emission control line EL. In another embodiment, at least one of signal lines, the first and second initialization voltage lines VIL1 and VIL2, and/or the driving voltage line PL may be shared by neighboring (e.g., adjacent) pixels.

A driving voltage ELVDD may be transferred to a first transistor T1 via the driving voltage line PL. An initialization voltage Vint for initializing the first transistor T1 and the OLED may be transmitted to the pixel P via the first and second initialization voltage lines VIL1 and VIL2.

The first scan line SL1, the second scan line SL2, the third scan line SL3, the emission control line EL, and the first and second initialization voltage lines VIL1 and VIL2 may extend in a first direction (e.g., the x direction of FIG. 1) to be arranged apart from each other in each row. The data line DL and the driving voltage line PL may extend in the second direction (e.g., the y direction of FIG. 1) to be arranged apart from each other in each column.

In FIG. 6, from among the first to seventh transistors T1 to T7, a third transistor T3 and a fourth transistor T4 may be implemented as an n-channel MOSFET (NMOS), and the other transistors may be implemented as a p-channel MOSFET (PMOS). In FIG. 6, first electrodes of the first to seventh transistors T1 to T7 may be source electrodes or drain electrodes, and second electrodes thereof may be drain electrodes or source electrodes.

The first transistor T1 may include a gate electrode connected to a node N2, a first electrode connected to a node N1, and a second electrode. The first electrode of the first transistor T1 is connected to the driving voltage line PL via a fifth transistor T5, and the second electrode is electrically connected to the OLED via a sixth transistor T6. The first transistor T1 acts as a driving transistor and receives the data signal DATA by the switching operation of a second transistor T2 and supplies a driving current $I_{OLED}$ to the OLED.

A gate electrode of the second transistor T2 is connected to the first scan line SL1, a first electrode thereof is connected to the data line DL, and a second electrode thereof is connected to the node N1 and to the driving voltage line PL via the fifth transistor T5. The second transistor T2 is turned on by a first scan signal SSn received via the first scan line SL1 and performs a switching operation of transmitting the data signal DATA received via the data line DL to the node N1.

A gate electrode of the third transistor T3 is connected to the emission control line EL, a first electrode thereof is connected to the gate electrode of the first transistor T1, a second electrode thereof is connected to the second electrode of the first transistor T1 and to the OLED via the sixth transistor T6. The third transistor T3 is turned on by a first emission control signal ESn received via the emission control line EL and diode-connects the first transistor T1.

A gate electrode of the fourth transistor T4 is connected to the third scan line SL3, a first electrode thereof is connected to a first initialization voltage line VIL1, and a second electrode thereof is connected to the gate electrode of the first transistor T1. The fourth transistor T4 is turned on by a second emission control signal ESn−k, where k≥1, received via the third scan line SL3, and transmits the initialization voltage Vint from the first initialization voltage line VIL1 to the gate electrode of the first transistor T1, thereby initializing a voltage of the gate electrode of the first transistor T1.

The second emission control signal ESn−k may be a previous emission control signal that is output before the first emission control signal ESn (e.g., the present emission control signal). The previous emission control signal may be an emission control signal, for example, ESn−1, just before (e.g., output just before) the first emission control signal ESn, or one of the (even earlier) emission control signals, for example, ESn−2, ESn−3, etc., that have been output before that.

A gate electrode of the fifth transistor T5 is connected to the emission control line EL, a first electrode thereof is connected to the driving voltage line PL, and a second electrode thereof is connected to the node N1. A gate electrode of the sixth transistor T6 is connected to the emission control line EL, a first electrode thereof is connected to the second electrode of the first transistor T1, and a second electrode thereof is connected to the OLED. The fifth transistor T5 and the sixth transistor T6 are concurrently (e.g., simultaneously) turned on by the first emission control signal ESn received via the emission control line EL and form a current path so that the driving current IDLED may flow in a direction from the driving voltage line PL to the OLED.

A gate electrode of the seventh transistor T7 is connected to the second scan line SL2, a first electrode thereof is connected to a second initialization voltage line VIL2, and a second electrode is connected to the OLED. The seventh transistor T7 is turned on by a second scan signal SSn−1 or SSn+1, received via the second scan line SL2, and transmits the initialization voltage Vint from the second initialization voltage line VIL2 to the OLED, thereby initializing the OLED.

A second scan signal SSn−1 may be a previous scan signal that is output before the first scan signal SSn (the present scan signal). In other embodiments, the second scan signal SSn+1 may be a next scan signal output after the first scan signal SSn. In some embodiments, the seventh transistor T7 may be omitted.

The first capacitor Cst may include a first electrode CE1 and a second electrode CE2. The first electrode CE1 is connected to the gate electrode of the first transistor T1, and the second electrode CE2 is connected to the driving voltage line PL. The first capacitor Cst may maintain a voltage applied to the gate electrode of the first transistor T1 by storing and maintaining a voltage corresponding to a difference between opposite end voltages of the driving voltage line PL and the gate electrode of the first transistor T1.

The second capacitor Cbt may include a third electrode CE3 and a fourth electrode CE4. The third electrode CE3 is connected to the first scan line SL1 and the gate electrode of the second transistor T2. The fourth electrode CE4 is connected to the gate electrode of the first transistor T1 and the first electrode CE1 of the first capacitor Cst. The second capacitor Cbt, which is a boosting capacitor, may decrease a voltage (e.g., a black voltage) to display black by increasing the voltage of the node N2 when the first scan signal SSn received via the first scan line SL1 is a voltage to turn off the second transistor T2.

The OLED may include a pixel electrode and a counter electrode, and the counter electrode may receive a common voltage ELVSS. The OLED may receive the driving current $I_{OLED}$ from the first transistor T1 and emit light, thereby displaying an image.

In the present embodiment, at least one of the transistors T1 to T7 may include a semiconductor layer including an oxide, and the others may include a semiconductor layer including silicon. For example, the first transistor T1 that affects (e.g., directly affects) the brightness of a display device may include a semiconductor layer including polycrystal silicon having high reliability, thereby implementing a high-resolution display device.

Oxide semiconductors have high carrier mobility and low leakage current, such that a voltage drop is not great (e.g., is not substantial) even when a driving time is long. For example, when a color change in an image according to a voltage drop during low frequency driving is not large, low frequency driving is possible. As such, as the oxide semiconductor provides relatively low leakage current, by employing at least one of the third transistor T3 and the fourth transistor T4 connected to the gate electrode of the first transistor T1 as including oxide semiconductor, a leakage current that flows toward the gate electrode of the first transistor T1 may be prevented or substantially prevented and power consumption may be reduced.

Referring to FIG. 7, a detailed operation of the pixel P according to an embodiment is described below.

During a first period t1, when a second emission control signal ESn−2 having a high level is supplied via the third scan line SL3, the fourth transistor T4 is turned on, and the first transistor T1 is initialized by the initialization voltage Vint supplied from the first initialization voltage line VIL1.

During a second period t2, the third transistor T3 is turned on by the first emission control signal ESn having a high level supplied via the emission control line EL. In this state, the first transistor T1 is diode-connected by the turned-on third transistor T3 and is biased in a forward direction. During a 2-1 period t21 that is a part of the second period t2, that is, the first half of the second period t2, when the second scan signal SSn−1 having a low level is supplied via the second scan line SL2, the seventh transistor T7 is turned on, and the OLED is initialized by the initialization voltage Vint supplied via the second initialization voltage line VIL2. During a 2-2 period t22 that is a part of the second period t2, that is, the second half of the second period t2, when the first scan signal SSn having a low level is supplied via the first scan line SL1, the second transistor T2 is turned on. A compensation voltage obtained by compensating a threshold voltage Vth of the first transistor T1 in the data signal DATA supplied via the data line DL is applied to the gate electrode of the first transistor T1. The driving voltage ELVDD and the compensation voltage are applied to opposite ends of the first capacitor Cst, and electric charges corresponding to the voltage difference between the opposite ends of the first capacitor Cst are stored.

During a third period t3, the first emission control signal ESn supplied via the emission control line EL is shifted from a high level to a low level, and the fifth transistor T5 and the sixth transistor T6 is turned on by the first emission control signal ESn having a low level. Accordingly, the driving current IDLED according to a voltage difference between a voltage of the gate electrode of the first transistor T1 and the driving voltage ELVDD is generated, and the driving current $I_{OLED}$ is supplied to the OLED via the sixth transistor T6.

FIG. 7 illustrates an example in which an emission control signal applied to the gate electrode of the fourth transistor T4 is the second emission control signal ESn−2, and a scan signal applied to the gate electrode of the seventh transistor T7 is the second scan signal SSn−1. In another embodiment, as described above, the emission control signal ESn−1 and the scan signal SSn+1 may be respectively used as a second emission control signal and a second scan signal.

Figure 8A:
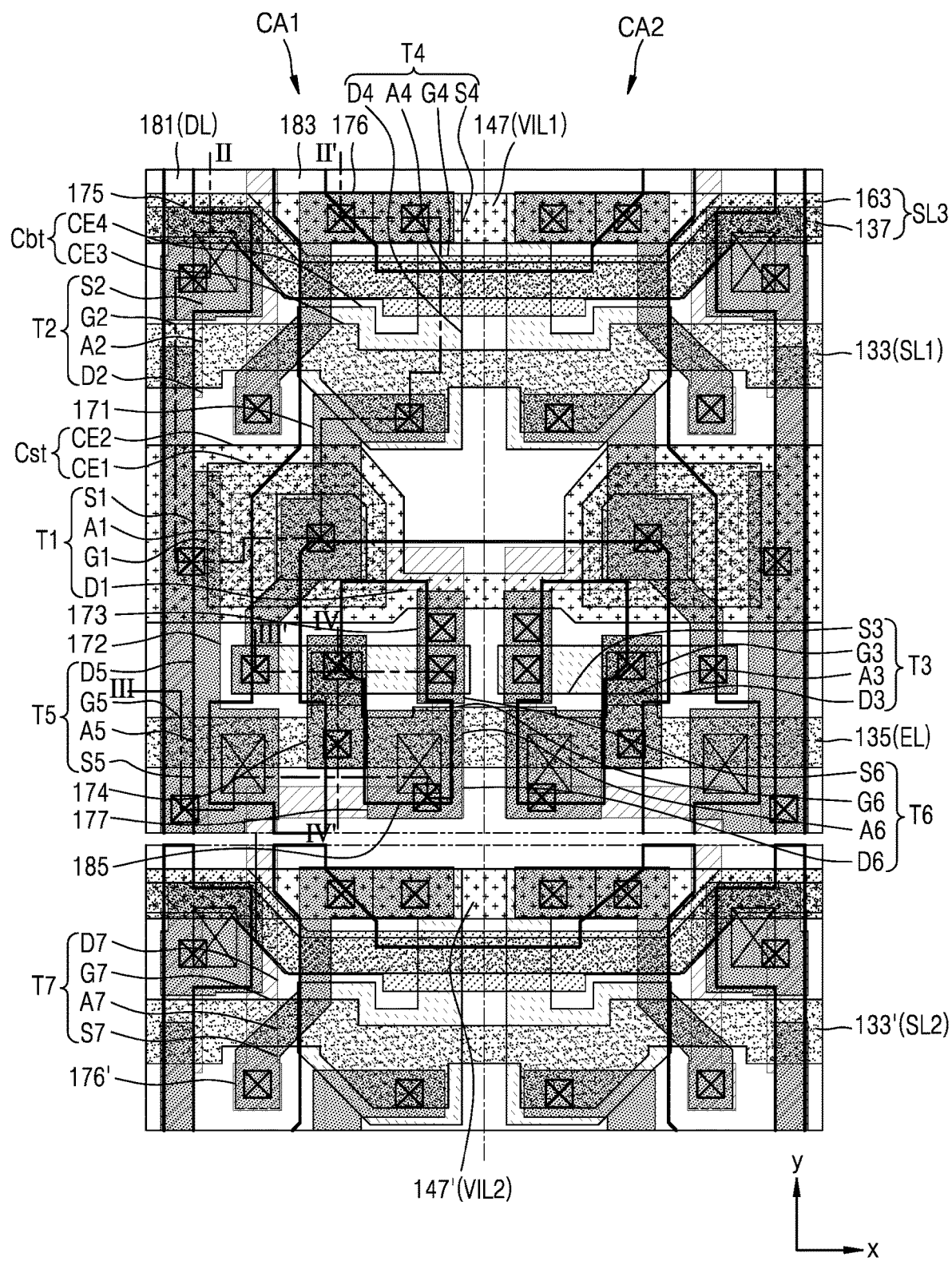
FIGS. 8A and 8B are schematic diagrams of a plurality of thin film transistors and capacitors arranged on a pair of pixel circuits of a display device according to an embodiment.
Figure 8B:
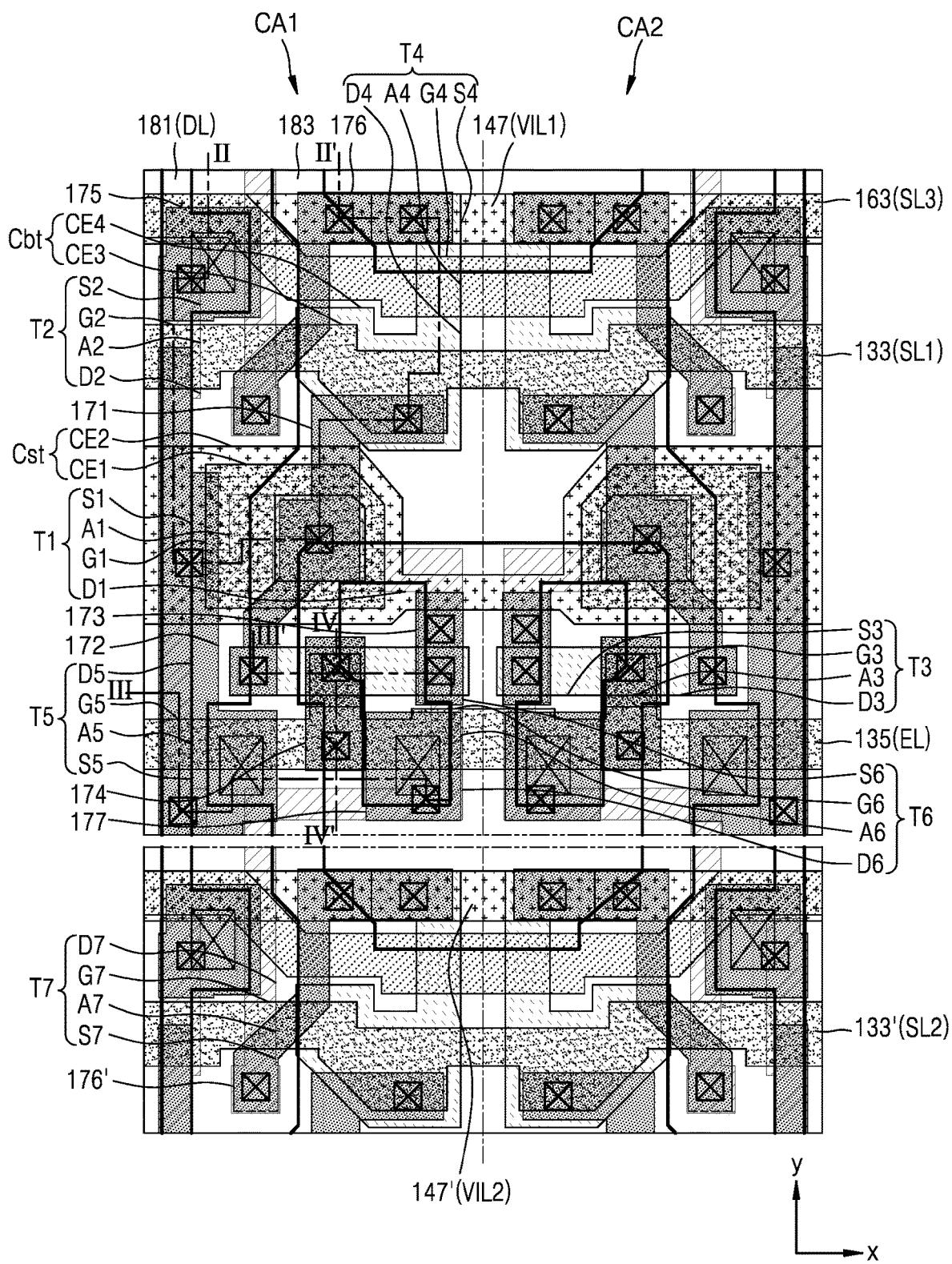
Figure 9:
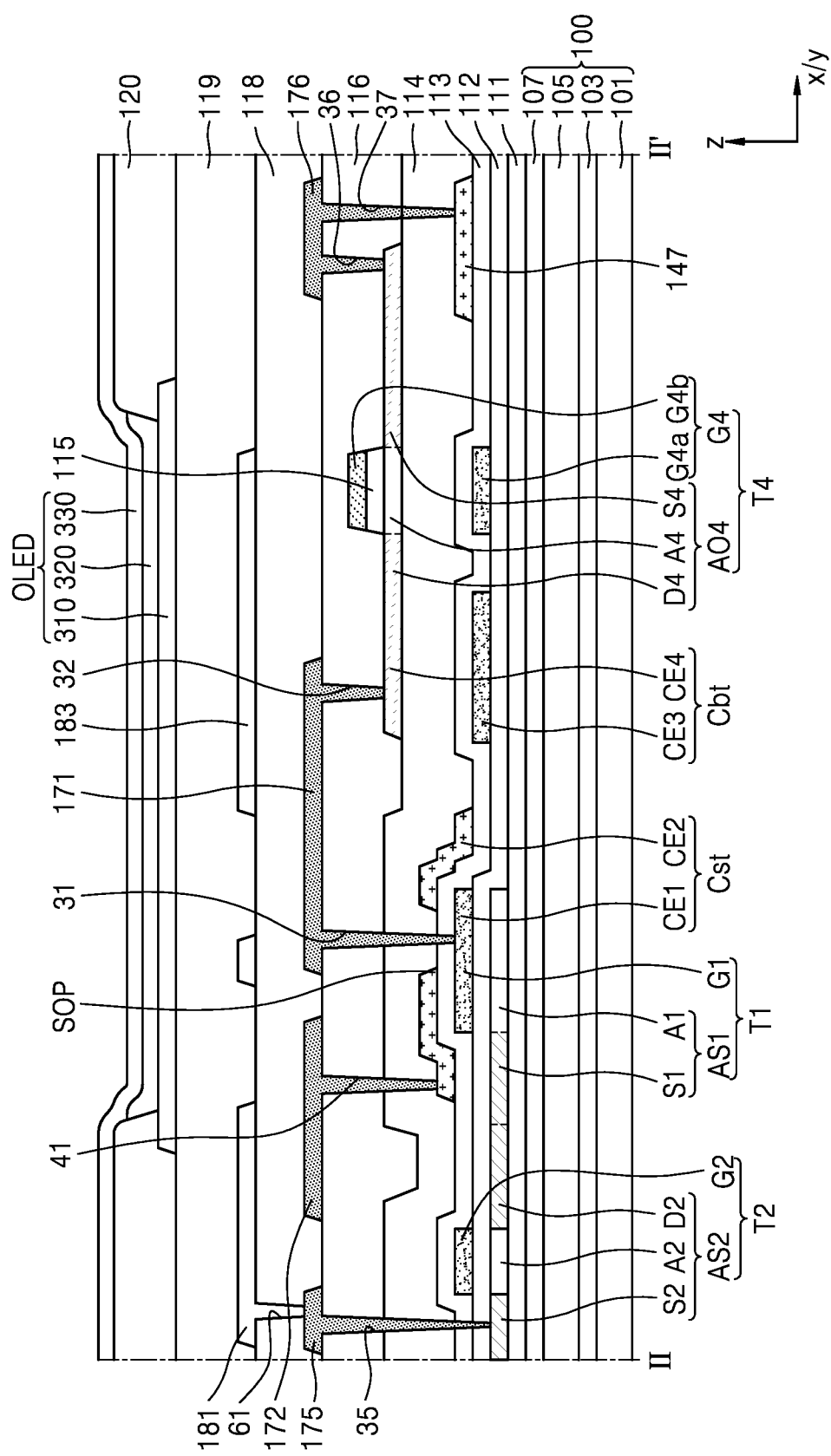
FIG. 9 is a schematic cross-sectional view taken along the line II-II' of FIG. 8A.
Figure 10:
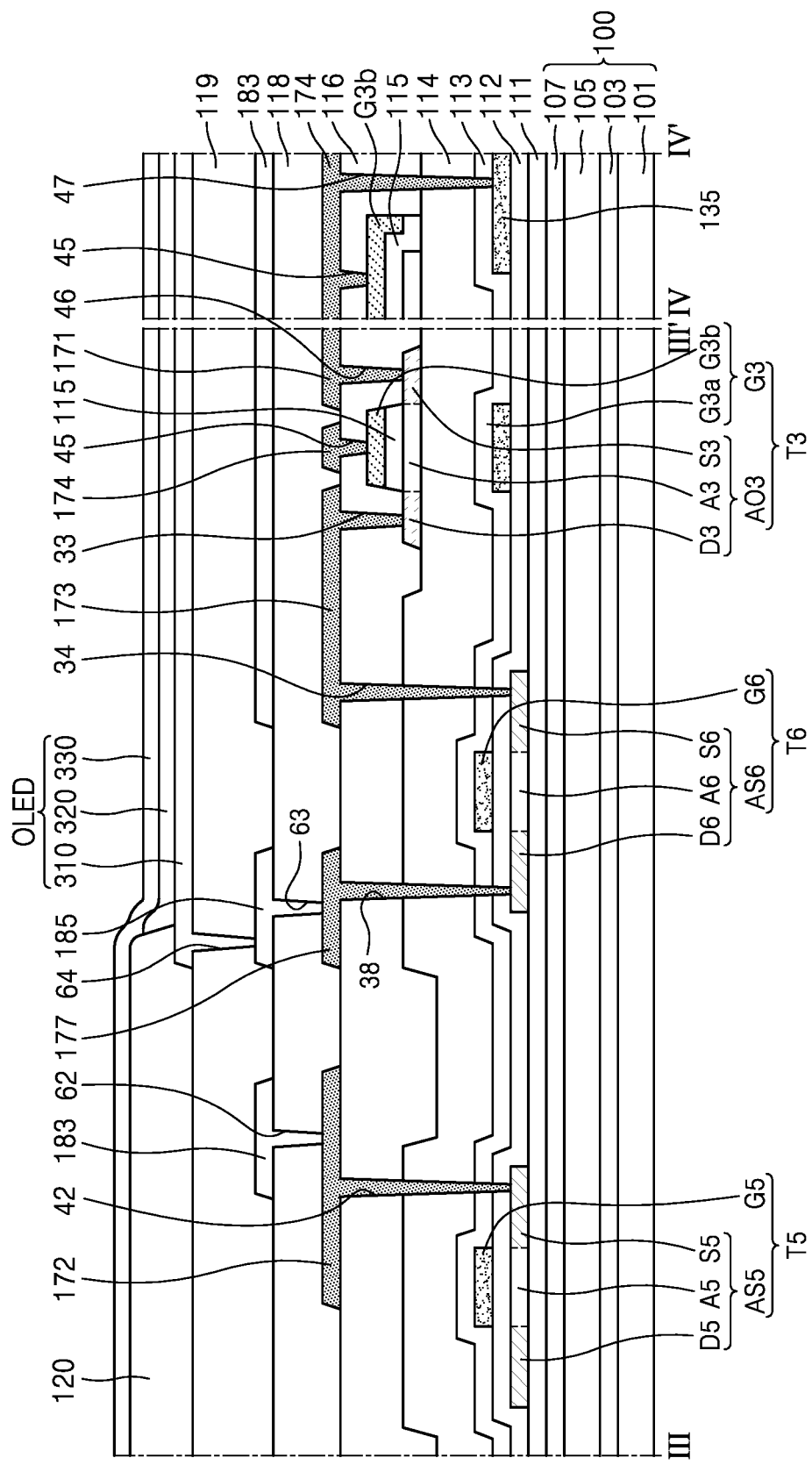
FIG. 10 is a schematic cross-sectional view taken along the lines III-III' and IV-IV' of FIG. 8A.
Figure 11:
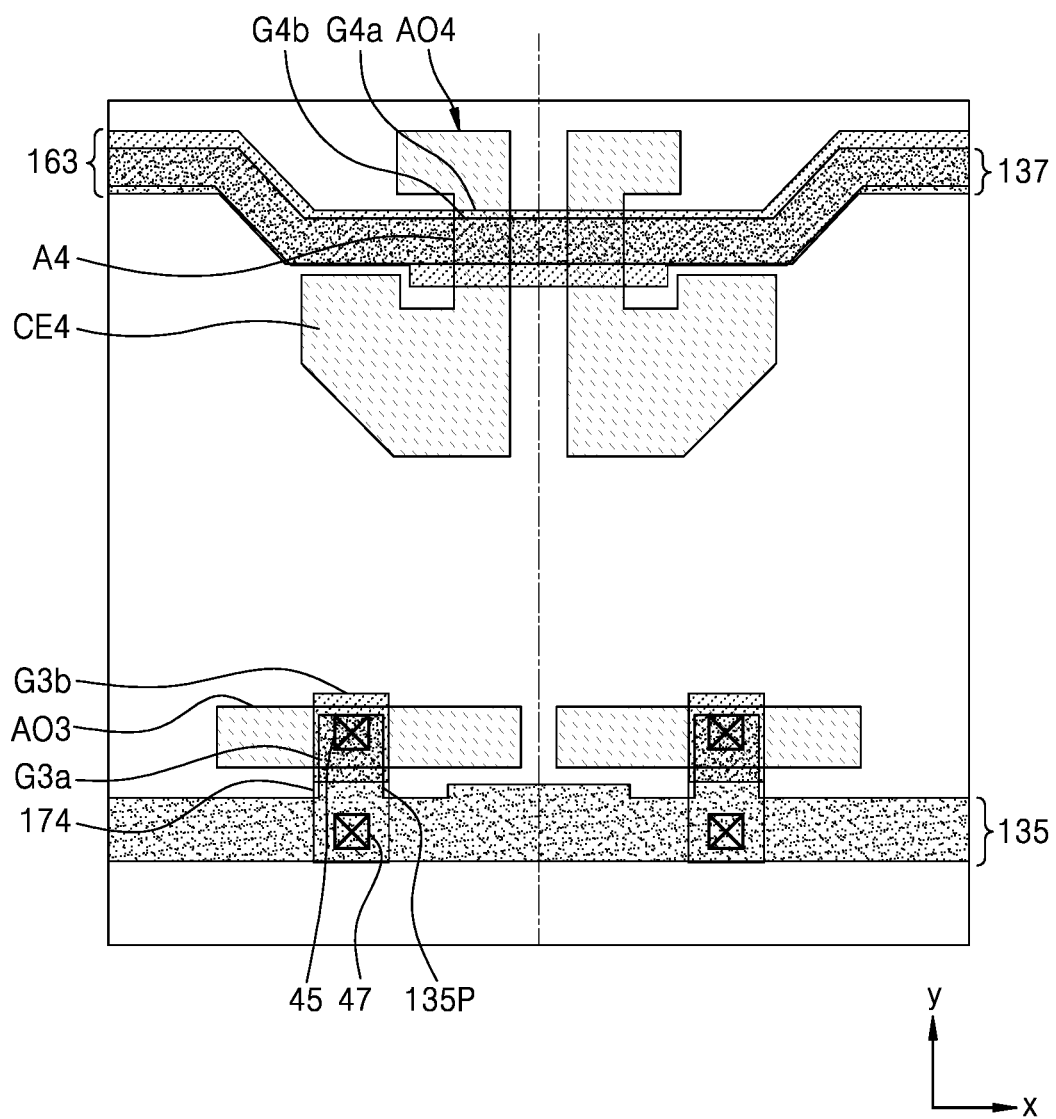
FIGS. 11 and 12 each illustrate layouts of only some elements shown in FIG. 8A.
Figure 12:
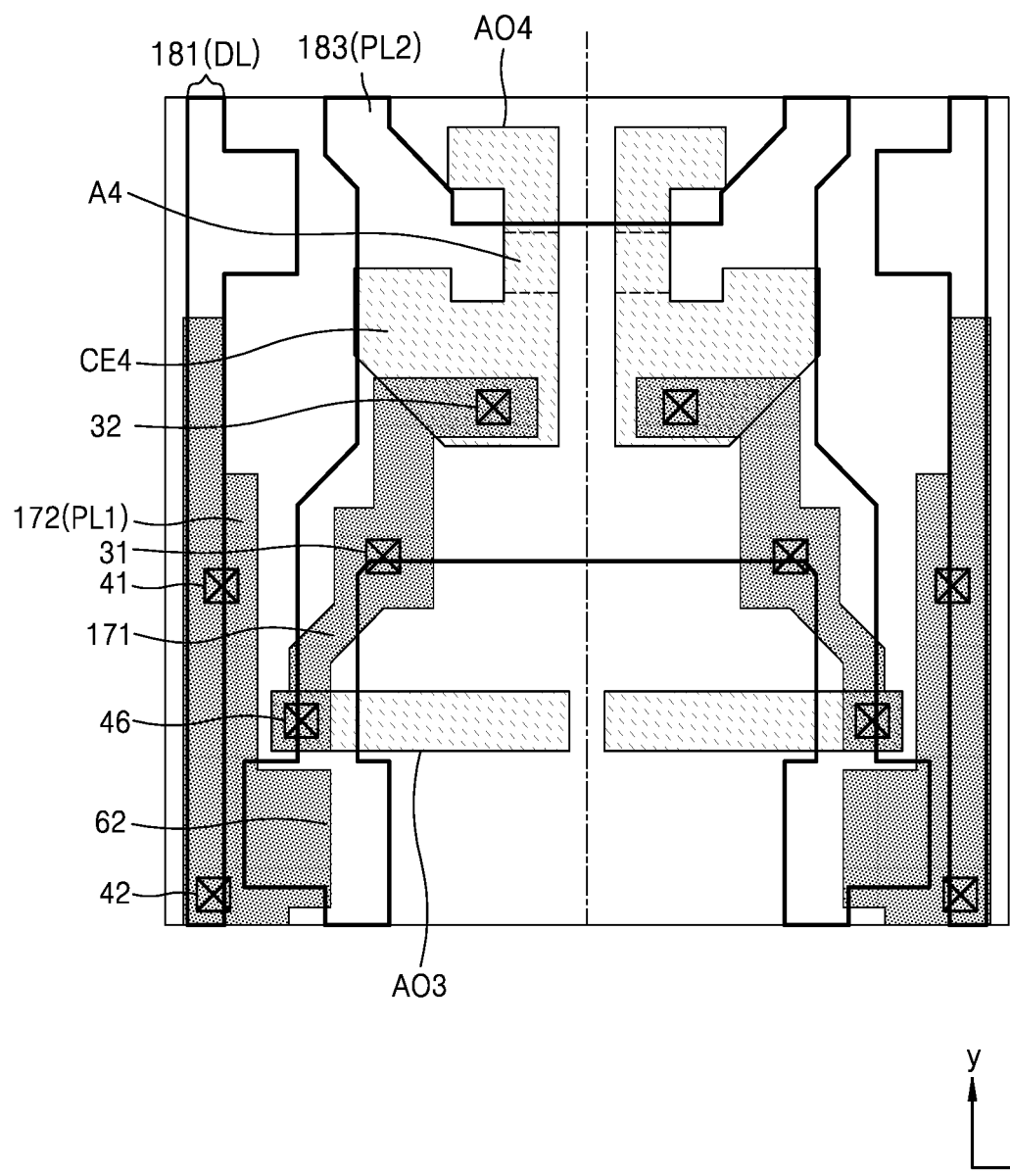

FIGS. 8A and 8B are schematic diagrams of a plurality of thin film transistors and capacitors arranged in a pair of pixel circuits of a display device according to an embodiment. FIG. 9 is a cross-sectional view taken along the line II-II' of FIG. 8A, and FIG. 10 is a schematic cross-sectional view taken along the lines III-III' and IV-IV' of FIG. 8A. FIGS. 11 and 12 each illustrate layouts of only some of the constituent elements shown in FIG. 8A.

FIG. 8A illustrates a pair of pixels disposed in the same row but in adjacent columns. In FIG. 8A, a pixel circuit of a pixel disposed in a left pixel area CA1 and a pixel circuit of a pixel disposed in a right pixel area CA2 have left and right symmetrical structure.

Referring to FIG. 8A, a pixel circuit of a display device according to an embodiment may be connected to a first scan line 133, a second scan line 133', the third scan line SL3, an emission control line 135, first and second initialization voltage lines 147 and 147', which extend in a first direction, and a data line 181 and first and second driving voltage lines 172 and 183, which extend in a second direction intersecting (e.g., crossing) the first direction.

Furthermore, the pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

In an embodiment, the first transistor T1, the second transistor T2, the fifth transistor T5, the sixth transistor T6, and the seventh transistor T7 each may be provided as a thin film transistor including a silicon semiconductor. The third transistor T3 and the fourth transistor T4 each may be provided as a thin film transistor including an oxide semiconductor.

The second scan line 133' may be the first scan line SL1 in a previous row or a next row. FIG. 8A illustrates an example of a pixel circuit including the first scan line SL1 in the next row as the second scan line 133'.

The semiconductor layers of the first transistor T1, the second transistor T2, the fifth transistor T5, the sixth transistor T6, and the seventh transistor T7 may be disposed on the same layer and may include the same material. For example, the semiconductor layers may include polycrystal silicon. The semiconductor layers of the first transistor T1, the second transistor T2, the fifth transistor T5, the sixth transistor T6, and the seventh transistor T7 may be connected to each other (e.g. may be continuous or integral with each other) and may be bent in various shapes.

Each of the semiconductor layers of the first transistor T1, the second transistor T2, the fifth transistor T5, the sixth transistor T6, and the seventh transistor T7 may include a channel region, and a source region and a drain region at both sides (e.g., opposite sides) of the channel region. In an embodiment, the source region and the drain region may be doped with impurities, and the impurities may include N-type impurities or P-type impurities. The source region and the drain region may respectively correspond to a source electrode and a drain electrode. The source region and the drain region may be switched with each other according to the characteristics of a transistor. In the following description, terms such as a source region and a drain region are used instead of a source electrode and a drain electrode.

The first transistor T1 may include a first semiconductor layer AS1 and a first gate electrode G1. The first semiconductor layer AS1 may include a first channel region A1, and a first source region S1 and a first drain region D1 at both sides of the first channel region A1. The first semiconductor layer AS1 has a bent shape, for example, a shape bent multiple times, such as "⊏", "⊒", "S", "M", "W", etc., thereby forming a long channel length within a small space. Because the first channel region A1 is formed to be relatively long, a driving range of a gate voltage applied to the first gate electrode G1 increases so that gradation of light emitted from the OLED may be more accurately controlled, thereby improving display quality. In some embodiments, the first semiconductor layer AS1 may be provided in a linear shape, not in a bent shape. The first gate electrode G1 is an island type and is provided to overlap the first channel region A1 with a first gate insulating layer 112 being between the first gate electrode G1 and the first channel region A1 (see, e.g., FIG. 9).

The first capacitor Cst may be disposed to overlap the first transistor T1. The first capacitor Cst may include the first electrode CE1 and the second electrode CE2. The first gate electrode G1 may function not only as a control electrode of the first transistor T1 but also as the first electrode CE1 of the first capacitor Cst. For example, the first gate electrode G1 and the first electrode CE1 may be integrally formed (e.g., may be a single body). The second electrode CE2 of the first capacitor Cst is provided to overlap the first electrode CE1, and a second gate insulating layer 113 is between the first electrode CE1 and the second electrode CE2 (see, e.g., FIG. 9). The second gate insulating layer 113 may function as a dielectric layer of the first capacitor Cst.

A node connection line 171 may be electrically connected to the first electrode CE1 and a third semiconductor layer AO3 of the third transistor T3. The second electrode CE2 may be electrically connected to the first driving voltage line 172, and the first driving voltage line 172 may be electrically connected to the second driving voltage line 183. The first driving voltage line 172 and the second driving voltage line 183 may extend in the second direction. The second electrode CE2 may extend in the first direction and may transmit the driving voltage ELVDD in the first direction. Accordingly, in the display area DA, a plurality of the first driving voltage line 172 and the second driving voltage line 183 and a plurality of the second electrode CE2 may form a mesh structure.

The second transistor T2 may include a second semiconductor layer AS2 and a second gate electrode G2. The second semiconductor layer AS2 may include a second channel region A2, and a second source region S2 and a second drain region D2 at both sides of the second channel region A2. The second source region S2 may be electrically connected to the data line 181, and the second drain region D2 may be connected to the first source region S1. The second gate electrode G2 may be a part of the first scan line 133.

The fifth transistor T5 may include a fifth semiconductor layer AS5 and a fifth gate electrode G5. The fifth semiconductor layer AS5 may include a fifth channel region A5, and a fifth source region S5 and a fifth drain region D5 at both sides of the fifth channel region A5. The fifth source region S5 may be electrically connected to the first driving voltage line 172, and the fifth drain region D5 may be connected to the first source region S1. The fifth gate electrode G5 may be a part of the emission control line 135.

The sixth transistor T6 may include a sixth semiconductor layer AS6 and a sixth gate electrode G6. The sixth semiconductor layer AS6 may include a sixth channel region A6, and a sixth source region S6 and a sixth drain region D6 at both sides of the sixth channel region A6. The sixth source region S6 may be connected to the first drain region D1, and the sixth drain region D6 may be electrically connected to a pixel electrode 310 of the OLED (see, e.g., FIG. 10). The sixth gate electrode G6 may be a part of the emission control line 135.

The seventh transistor T7 may include a seventh semiconductor layer and a seventh gate electrode G7. The seventh semiconductor layer may include a seventh channel region A7, and a seventh source region S7 and a seventh drain region D7 at both sides of the seventh channel region A7. The seventh source region S7 may be electrically connected to the second initialization voltage line 147', and the seventh drain region D7 may be connected to the sixth drain region D6. The seventh gate electrode G7 may be a part of the second scan line 133'.

A first interlayer insulating layer 114 (see, e.g., FIGS. 9 and 10) may be disposed on the first, second, and fifth to seventh transistors T1, T2, T5, T6, and T7, which include the silicon semiconductor, and the third and fourth transistors T3 and T4, which include the oxide semiconductor, may be disposed on the first interlayer insulating layer 114.

The semiconductor layers of the third transistor T3 and the fourth transistor T4 may be disposed on the same layer and may include the same material. For example, the semiconductor layers each may include an oxide semiconductor.

The semiconductor layers each may include a channel region, and a source region and a drain region at both sides of the channel region. In an embodiment, the source region and the drain region may have high carrier concentration due to a plasma process. The source region and the drain region may correspond to a source electrode and a drain electrode, respectively. In the following description, terms such as a source region and a drain region are used instead of a source electrode and a drain electrode.

The third transistor T3 may include a third semiconductor layer AO3 including an oxide semiconductor and a third gate electrode G3. The third semiconductor layer AO3 may include a third channel region A3, and a third source region S3 and a third drain region D3 at both sides of the third channel region A3. The third source region S3 may be bridge-connected to the first gate electrode G1 via the node connection line 171. The third drain region D3 may be electrically connected to the first semiconductor layer AS1 of the first transistor T1 and the sixth semiconductor layer AS6 of the sixth transistor T6. The third gate electrode G3 may be a part of the emission control line EL.

The fourth transistor T4 may include a fourth semiconductor layer AO4 including an oxide semiconductor and a fourth gate electrode G4. The fourth semiconductor layer AO4 may include a fourth channel region A4, and a fourth source region S4 and a fourth drain region D4 at both sides of the fourth channel region A4. The fourth source region S4 may be electrically connected to the first initialization voltage line 147, and the fourth drain region D4 may be bridge-connected to the first gate electrode G1 via the node connection line 171. The fourth gate electrode G4 may be a part of the third scan line SL3.

A third gate insulating layer 115 (see, e.g., FIGS. 9 and 10) is disposed corresponding to each channel region between the third semiconductor layer AO3 and the third gate electrode G3, and between the fourth semiconductor layer AO4 and the fourth gate electrode G4.

The third electrode CE3 of the second capacitor Cbt may be a part of the first scan line 133 and is connected to the second gate electrode G2. The fourth electrode CE4 of the second capacitor Cbt is disposed to overlap the third electrode CE3, and may be provided as an oxide semiconductor. The fourth electrode CE4 may be provided on the same layer as the fourth semiconductor layer AO4 of the fourth transistor T4 and may extend from the fourth semiconductor layer AO4.

A second interlayer insulating layer 116 (see, e.g., FIGS. 9 and 10) may be disposed on the third and fourth transistors T3 and T4, which include the oxide semiconductor, and the first driving voltage line 172 and the node connection line 171 may be disposed on the second interlayer insulating layer 116.

A first planarization layer 118 (see, e.g., FIGS. 9 and 10) is disposed on the first driving voltage line 172, and the data line 181 and the second driving voltage line 183 may extend in the second direction on a first planarization layer 118.

In an embodiment, the first scan line 133, the second scan line 133', and the emission control line 135 may be provided on the same layer and may include the same material as the first gate electrode G1.

The third scan line SL3 may include a lower scan line 137 and an upper scan line 163 that are disposed on different layers. The lower scan line 137 may be provided on the same layer and may include the same material as the first electrode CE1 of the first capacitor Cst. The upper scan line 163 may be disposed on the third gate insulating layer 115. The lower scan line 137 may be disposed to overlap at least a part of the upper scan line 163. The lower scan line 137 and the upper scan line 163 may correspond to a part of the fourth gate electrode G4 of the fourth transistor T4, and the fourth transistor T4 may have a dual gate structure in which a control electrode is respectively provided above and below the semiconductor layer.

In another embodiment, as illustrated in FIG. 8B, the third scan line SL3 may include only the upper scan line 163. The upper scan line 163 may correspond to a part of the fourth gate electrode G4 of the fourth transistor T4, and the fourth transistor T4 may have a single gate structure in which the control electrode is provided above the semiconductor layer.

The first initialization voltage line 147 and the second initialization voltage line 147' may be provided on the same layer and may include the same material as the second electrode CE2 of the first capacitor Cst.

The structure of a display device according to an embodiment is will be described in order of stacking in detail with reference to FIGS. 9 and 10, below.

FIGS. 9 and 10 are cross-sectional views of portions of a display device corresponding to the first transistor T1, the second transistor T2, the third transistor T3, the fourth transistor T4, the fifth transistor T5, the sixth transistor T6, the first capacitor Cst, the second capacitor Cbt, and the OLED shown in FIG. 8A. Some elements shown in FIG. 8A may be omitted from FIGS. 9 and 10 for convenience of explanation.

The substrate 100 may include a glass material, a ceramic material, a metal material, or a material having flexible or bendable characteristics (e.g., a flexible or bendable material). When the substrate 100 has flexible or bendable characteristics, the substrate 100 may include polymer resin, such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 100 may have a single layer or a multilayer structure of the material, and the multilayer structure may further include an inorganic layer. For example, the substrate 100 may include a first base layer 101, a first barrier layer 103, a second base layer 105, and a second barrier layer 107. The first base layer 101 and the second base layer 105 each may include polymer resin. The first base layer 101 and the second base layer 105 each may include transparent polymer resin. The first barrier layer 103 and the second barrier layer 107, as barrier layers for preventing (or substantially preventing) intrusion of external foreign materials, may have a single layer or a multilayer structure including an inorganic material, such as a silicon nitride ($SiN_x$) or a silicon oxide ($SiO_x$).

A buffer layer 111 may be disposed on the substrate 100. The buffer layer 111 may increase smoothness of an upper surface of the substrate 100, and the buffer layer 111 may include an oxide film, such as a silicon oxide ($SiO_x$), and/or a nitride film, such as a silicon nitride ($SiN_x$) or a silicon oxynitride (SiON).

A barrier layer may be further provided between the substrate 100 and the buffer layer 111. The barrier layer may prevent or reduce intrusion of impurities from the substrate 100 into a silicon semiconductor layer. The barrier layer may include an inorganic material, such as an oxide or nitride, and/or an organic material and may have a single layer or multilayer structure of an inorganic material and an organic material.

The silicon semiconductor layer, that is, a semiconductor layer of each of the first transistor T1, the second transistor T2, the fifth transistor T5, the sixth transistor T6, and the seventh transistor T7, may be disposed on the buffer layer 111.

The silicon semiconductor layer may include the first semiconductor layer AS1 of the first transistor T1 including the first channel region A1, the first source region S1, and the first drain region D1, the second semiconductor layer AS2 of the second transistor T2 including the second channel region A2, the second source region S2, and the second drain region D2, the fifth semiconductor layer AS5 of the fifth transistor T5 including the fifth channel region A5, the fifth source region S5, and the fifth drain region D5, the sixth semiconductor layer AS6 of the sixth transistor T6 including the sixth channel region A6, the sixth source region S6, and the sixth drain region D6, and the seventh semiconductor layer AS7 of the seventh transistor T7 including the seventh channel region A7, the seventh source region S7, and the seventh drain region D7. For example, the channel region, the source region, and the drain region of each of the first, second, and fifth to seventh transistors T1, T2, T5, T6, and T7 may be partial areas of the silicon semiconductor layer.

The first gate insulating layer 112 may be located on the silicon semiconductor layer. The first gate insulating layer 112 may include an inorganic material including an oxide or a nitride. For example, the first gate insulating layer 112 may include at least of a silicon oxide ($SiO_x$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

The first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be disposed on the first gate insulating layer 112. Furthermore, the first scan line 133, the second scan line 133', the emission control line 135, and the lower scan line 137 of the third scan line SL3 may extend in the first direction on the first gate insulating layer 112. A part of the first scan line 133 may be the third electrode CE3 of the second capacitor Cbt. As illustrated in, for example, FIG. 11, a protruding portion 135P of the emission control line 135 may be a lower gate electrode G3a of the third transistor T3. A part of the lower scan line 137 of the third scan line SL3 may be a lower gate electrode G4a of the fourth transistor T4.

The first gate electrode G1 of the first transistor T1 may be an island (e.g., may be of an island type). The second gate electrode G2 of the second transistor T2 may be a part of the first scan line 133 intersecting the semiconductor layer. The seventh gate electrode G7 of the seventh transistor T7 may be a part of the second scan line 133' intersecting the semiconductor layer. The fifth gate electrode G5 of the fifth transistor T5 and the sixth gate electrode G6 of the sixth transistor T6 may be parts of the emission control line 135 intersecting the semiconductor layer.

The first gate electrode G1 of the first transistor T1 may function not only as the control electrode of the first transistor T1 but also as the first electrode CE1 of the first capacitor Cst.

The gate electrodes of the first transistor T1, the second transistor T2, the fifth transistor T5, the sixth transistor T6, and the seventh transistor T7 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), etc. and may include one or more materials and may be formed in a single layer or as a multilayer structure.

The second gate insulating layer 113 may be disposed on the gate electrodes. The second gate insulating layer 113 may include an inorganic material including an oxide or a nitride. For example, the second gate insulating layer 113 may include at least one of $SiO_x$, $SiN_x$, SiON, $Al_2O_3$, $TiO_2$, $Ta_2O_5$, $HfO_2$, or $ZnO_2$.

The second electrode CE2 may be disposed to overlap the first electrode CE1 on the second gate insulating layer 113. The second electrode CE2 may include an opening SOP. The opening SOP is formed by removing a part of the second electrode CE2 and may have a closed shape.

The second gate insulating layer 113 may function as the dielectric layer of the first capacitor Cst. The second electrodes CE2 of adjacent pixels may be connected to each other. The second electrodes CE2 of adjacent pixels may be integrally formed (e.g., may be a single body).

The second electrode CE2 of the first capacitor Cst may include one or more material from among Al, Pt, Pd, Ag, Mg, Au, Ni, Nd, Ir, Cr, Li, Ca, Mo, Ti, W, Cu, etc. and may be formed in a single layer or as a multilayer structure.

The first initialization voltage line 147 and the second initialization voltage line 147' may include the same material as the second electrode CE2 of the first capacitor Cst and may extend in the first direction on the second gate insulating layer 113.

The first interlayer insulating layer 114 may be disposed on the second electrode CE2 of the first capacitor Cst. The first interlayer insulating layer 114 may include an inorganic material including an oxide or a nitride. For example, the first interlayer insulating layer 114 may include at least one of $SiO_x$, $SiN_x$, SiON, $Al_2O_3$, $TiO_2$, $Ta_2O_5$, $HfO_2$, or $ZnO_2$.

An oxide semiconductor layer including an oxide semiconductor may be disposed on the first interlayer insulating layer 114. The oxide semiconductor layer may be, for example, a Zn oxide-based material and may include a Zn oxide, an In—Zn oxide, a Ga—In—Zn oxide, etc. In some embodiments, the oxide semiconductor layer may include an IGZO (In—Ga—Zn—O), ITZO (In—Sn—Zn—O), or IGTZO (In—Ga—Sn—Zn—O) semiconductor, in which metal, such as In, Ga, or Sn, is contained in ZnO.

The semiconductor layer of each of the third transistor T3 and the fourth transistor T4 may include a channel region, and the source region and the drain region at both sides of the channel region. The source region and the drain region of each of the third transistor T3 and the fourth transistor T4 may be formed by making an oxide semiconductor conductive by adjusting the carrier concentration of the oxide semiconductor. For example, the source region and the drain region of each of the third transistor T3 and the fourth transistor T4 may be formed by increasing the carrier concentration of the oxide semiconductor through a plasma process on the oxide semiconductor by using a hydrogen (H)-based gas, a fluorine (F)-based gas, or a combination thereof.

The oxide semiconductor layer may include the third semiconductor layer AO3 of the third transistor T3 including the third channel region A3, the third source region S3, and the third drain region D3, and the fourth semiconductor layer AO4 of the fourth transistor T4 including the fourth channel region A4, the fourth source region S4, and the fourth drain region D4. For example, the channel region, the source region, and the drain region of each of the third transistor T3 and the fourth transistor T4 may be parts of the oxide semiconductor layer. The fourth source region S4 of the fourth transistor T4 may overlap the first initialization voltage line 147.

The fourth semiconductor layer AO4 may include the fourth electrode CE4 of the second capacitor Cbt. The fourth electrode CE4 of the second capacitor Cbt may extend from the fourth semiconductor layer AO4 of the fourth transistor T4. For example, the fourth electrode CE4 may include an oxide semiconductor and may be disposed on the first interlayer insulating layer 114. The second gate insulating layer 113 and the first interlayer insulating layer 114 are disposed between the third electrode CE3 and the fourth electrode CE4 of the second capacitor Cbt, and the second gate insulating layer 113 and the first interlayer insulating layer 114 may function as the dielectric layer of the second capacitor Cbt.

The upper scan line 163 of the third scan line SL3 may extend in the first direction on the oxide semiconductor layer. For example, the third scan line SL3 may be provided as two conductive layers disposed on different layers. The upper scan line 163 of the third scan line SL3 may be disposed to at least partially overlap the lower scan line 137. A portion of the upper scan line 163 of the third scan line SL3 that overlaps the fourth semiconductor layer AO4 may be an upper gate electrode G4b the fourth transistor T4. As illustrated in FIG. 11, an upper gate electrode G3b of the third transistor T3 that at least partially overlaps the protruding portion 135P of the emission control line 135 may be disposed on the third semiconductor layer AO3 of the third transistor T3. For example, the third transistor T3 and the fourth transistor T4 may have a dual gate structure in which the control electrode is respectively provided above and below the semiconductor layer. The upper gate electrode G3b of the third transistor T3 may be connected to a connection electrode 174 via a contact opening (e.g., a contact hole) 45 in the second interlayer insulating layer 116, and the connection electrode 174 may be connected to the emission control line 135 via a contact opening (e.g., a contact hole) 47 in the second gate insulating layer 113, the first interlayer insulating layer 114, and the second interlayer insulating layer 116.

The third gate insulating layer 115 may be disposed between the fourth semiconductor layer AO4 and the upper scan line 163 of the third scan line SL3 and between the third semiconductor layer AO3 and the upper gate electrode G3b. The third gate insulating layer 115 may be patterned in a shape corresponding to the upper scan line 163 of the third scan line SL3 and the emission control line 135.

The third gate insulating layer 115 may include an inorganic material including an oxide or a nitride. For example, the third gate insulating layer 115 may include at least one of $SiO_x$, $SiN_x$, SiON, $Al_2O_3$, $TiO_2$, $Ta_2O_5$, $HfO_2$, or $ZnO_2$. The upper gate electrode G3b of the third transistor T3 and the upper gate electrode G4b of the fourth transistor T4 may be disposed on the third gate insulating layer 115, may include at least one of Mo, Cu, or Ti, and may be formed in a single layer or as a multilayer structure.

The second interlayer insulating layer 116 may be disposed to cover the third transistor T3 and the fourth transistor T4. The second interlayer insulating layer 116 may be disposed on the upper gate electrode G3b of the third transistor T3 and the upper gate electrode G4b of the fourth transistor T4. The first driving voltage line 172, the node connection line 171, and the connection electrodes 173, 174, 175, 176, and 177 may be disposed on the second interlayer insulating layer 116.

The second interlayer insulating layer 116 may include an inorganic material including an oxide or a nitride. For example, the second interlayer insulating layer 116 may include at least one of $SiO_x$, $SiN_x$, SiON, $Al_2O_3$, $TiO_2$, $Ta_2O_5$, $HfO_2$, or $ZnO_2$.

The first driving voltage line 172, the node connection line 171, and the connection electrodes 173, 174, 175, 176, and 177 may include a highly conductive material, such as metal or a conductive oxide. For example, the first driving voltage line 172, the node connection line 171, and the connection electrodes 173, 174, 175, 176, and 177 may include at least one of Al, Cu, or Ti and may be formed in a single layer or as a multilayer structure. In some embodiments, the first driving voltage line 172, the node connection line 171, and the connection electrodes 173, 174, 175, 176, and 177 may be provided as a triple layer structure of titanium, aluminum, and titanium (Ti/Al/Ti) that are sequentially arranged (or stacked).

The first driving voltage line 172 may be connected to the second electrode CE2 of the first capacitor Cst via a contact opening (e.g., a contact hole) 41 formed in the first interlayer insulating layer 114 and the second interlayer insulating layer 116. The first driving voltage line 172 may be connected to the fifth source region S5 of the fifth transistor T5 via a contact opening (e.g., a contact hole) 42 formed in the first gate insulating layer 112, the second gate insulating layer 113, the first interlayer insulating layer 114, and the second interlayer insulating layer 116.

A part of the node connection line 171 may be connected to the first gate electrode G1 via a contact opening (e.g., a contact hole) 31. The contact opening 31 may penetrate the second interlayer insulating layer 116, the first interlayer insulating layer 114, and the second gate insulating layer 113 and may expose the first gate electrode G1. A part of the node connection line 171 is inserted into the contact opening 31 such that the node connection line 171 may be electrically connected to the first gate electrode G1.

The contact opening 31 is disposed apart from (e.g., is spaced from) an edge of the opening SOP within the opening SOP of the second electrode CE2, and the node connection line 171 inserted into the contact opening 31 may be electrically connected to the first electrode CE1 (e.g., the contact opening 31 does not contact or open to the second electrode CE2).

One end of the node connection line 171 may be connected to the third semiconductor layer AO3 via a contact opening (e.g., a contact hole) 46. The contact opening 46 may penetrate the second interlayer insulating layer 116 and expose the third semiconductor layer AO3.

The other end of the node connection line 171 may be connected to the fourth electrode CE4 of the second capacitor Cbt or the fourth semiconductor layer AO4 via a contact opening (e.g., a contact hole) 32. The contact opening 32 may penetrate the second interlayer insulating layer 116 and expose the fourth semiconductor layer AO4.

The fourth electrode CE4 of the second capacitor Cbt may be connected to the node connection line 171 and may be electrically connected to the first gate electrode G1. Accordingly, when the first scan signal SSn supplied via the first scan line SL1 is turned off (e.g., is set high), the second capacitor Cbt may clearly express a black gradation by increasing the voltage at the node N2 (see, e.g., FIG. 6).

One end of the connection electrode 173 may be connected to the sixth source region S6 of the sixth transistor T6 and the first drain region D1 of the first transistor T1 via a contact opening (e.g., a contact hole) 34. The contact opening 34 may penetrate the first gate insulating layer 112, the second gate insulating layer 113, the first interlayer insulating layer 114, and the second interlayer insulating layer 116 and expose the silicon semiconductor layer. The other end of the connection electrode 173 may be connected to the third drain region D3 of the third transistor T3 via a contact opening (e.g., a contact hole) 33. The contact opening 33 may penetrate the second interlayer insulating layer 116 and expose the oxide semiconductor layer.

The connection electrode 175 may be connected to the second source region S2 of the second transistor T2 via a contact opening (e.g., a contact hole) 35 formed in the first gate insulating layer 112, the second gate insulating layer 113, the first interlayer insulating layer 114, and the second interlayer insulating layer 116.

A part of the connection electrode 176 may be connected to the fourth source region S4 of the fourth transistor T4 via a contact opening (e.g., a contact hole) 36 formed in the second interlayer insulating layer 116 and to the first initialization voltage line 147 via a contact opening (e.g., a contact hole) 37 formed in the first interlayer insulating layer 114 and the second interlayer insulating layer 116.

The connection electrode 177 may be connected to the drain region D6 of the sixth transistor T6 via a contact opening (e.g., a contact hole) 38 formed in the first gate insulating layer 112, the second gate insulating layer 113, the first interlayer insulating layer 114, and the second interlayer insulating layer 116.

The first planarization layer 118 may be disposed on the first driving voltage line 172, the node connection line 171, and the connection electrodes 173, 174, 175, 176, and 177.

The data line 181, the second driving voltage line 183, and a connection electrode 185 may be disposed on the first planarization layer 118.

The data line 181 may be connected to the connection electrode 175 via a contact opening (e.g., a contact hole) 61 formed in the first planarization layer 118 and, thus, to the second source region S2 of the second transistor T2. As illustrated in FIG. 9, the data line 181 may be disposed to partially overlap the first driving voltage line 172. In view of a cross-section, the first driving voltage line 172 may be disposed on a layer between the first gate electrode G1 of the first transistor T1 and the data line DL. Accordingly, the first driving voltage line 172 may reduce coupling of the first gate electrode G1 and the data line 181.

The second driving voltage line 183 may be connected to the first driving voltage line 172 via a contact opening (e.g., a contact hole) 62 formed in the first planarization layer 118. As illustrated in FIG. 12, the second driving voltage line 183 may cover the fourth semiconductor layer AO4 of the fourth transistor T4. Accordingly, the second driving voltage line 183 may block light that may be applied from above the substrate 100 (e.g., may block light that may be incident to the substrate 100 from above). Furthermore, a part of the second driving voltage line 183 may overlap the node connection line 171.

The connection electrode 185 may be connected to the connection electrode 177 via a contact opening (e.g., a contact hole) 63 formed in the first planarization layer 118 and, thus, to the drain region D6 of the sixth transistor T6. The connection electrode 185 may be connected to the pixel electrode 310 via a contact opening (e.g., a contact hole) 64 formed in a second planarization layer 119 on the first planarization layer 118 and may transmit a signal applied through the sixth transistor T6 to the pixel electrode 310.

The first planarization layer 118 and the second planarization layer 119 may include an organic material, such as an acryl, benzocyclobutene (BCB), polyimide, or hexamethyldisiloxane (HMDSO). In other embodiments, the first planarization layer 118 and the second planarization layer 119 each may include an inorganic material. The first planarization layer 118 and the second planarization layer 119 may function as a protective layer covering the first to seventh transistors T1 to T7, and the upper surfaces of the first planarization layer 118 and the second planarization layer 119 may be flat (e.g., planar). The first planarization layer 118 and the second planarization layer 119 may be provided in a single layer or as a multilayer structure.

A pixel defining layer 120 may be disposed on the second planarization layer 119. The pixel defining layer 120 may have an opening corresponding to each pixel, that is, an opening that exposes at least a central (or center) portion of the pixel electrode 310, thereby defining a pixel. Furthermore, the pixel defining layer 120 may increase a distance between an edge of the pixel electrode 310 and a counter electrode 330 above the pixel electrode 310, thereby preventing generation of, for example, arc at the edge of the pixel electrode 310. The pixel defining layer 120 may include an organic material, for example, a polyimide or HMDSO.

An intermediate layer 320 of the OLED may include a low molecular weight material or a polymer material. When including a low molecular weight material, the intermediate layer 320 may have a structure in which a hole injection layer (HIL), a hole transport layer (HTL), an emission layer (EML), an electron transport layer (ETL), and/or an electron injection layer (EIL) are stacked, and the intermediate layer 320 may include various suitable organic materials, such as copper phthalocyanine (CuPc), N,N'-Di(naphthalene-1-yl)-N,N'-diphenyl-benzidine (NPB), or tris-8-hydroxyquinoline aluminum (Alq$_3$). The above layers may be formed by using a vacuum deposition method.

When including a polymer material, the intermediate layer 320 may include a structure including the HTL and the EML. In this embodiment, the HTL may include poly(3,4-ethylenedioxythiophene) (PEDOT), and the EML may include a polyphenylenevinylene (PPV)-based and a polyfluorene-based polymer materials. The intermediate layer 320 may be formed by using a screen printing method, an inkjet printing method, or a laser induced thermal imaging (LITI) method.

The intermediate layer 320 is not necessarily limited to the above-described structures and configuration and may have various suitable structures. The intermediate layer 320 may include an integrated layer over (e.g., extending continuously over) a plurality of pixel electrodes 310, or may include a layer patterned corresponding to each of the pixel electrodes 310.

The counter electrode 330 may be integrally formed with respect to a plurality of OLEDs corresponding to the pixel electrodes 310.

Because the OLED may be easily damaged by external moisture or oxygen, a thin film encapsulation layer or a sealing substrate may be disposed on the OLED to cover and protect the OLED. The thin film encapsulation layer may cover the display area DA and extend to the outside of the display area DA. The thin film encapsulation layer may include an inorganic encapsulation layer having at least one inorganic material and an organic encapsulation layer having at least one organic material. In some embodiments, the thin film encapsulation layer may be provided as a structure in which a first inorganic encapsulation layer/an organic encapsulation layer/a second inorganic encapsulation layer are stacked (or sequentially stacked). The sealing substrate may be disposed to face the substrate 100, and may be bonded to the substrate 100 in the peripheral area PA by using a sealing member, such as a sealant or frit.

Furthermore, a spacer for preventing mask scratches may be further provided on the pixel defining layer 120, and various functional layers, such as a polarization layer for reducing reflection of external light, a black matrix, a color filter, and/or a touch screen layer having a touch electrode, may be further provided on the thin film encapsulation layer.

Figure 13:
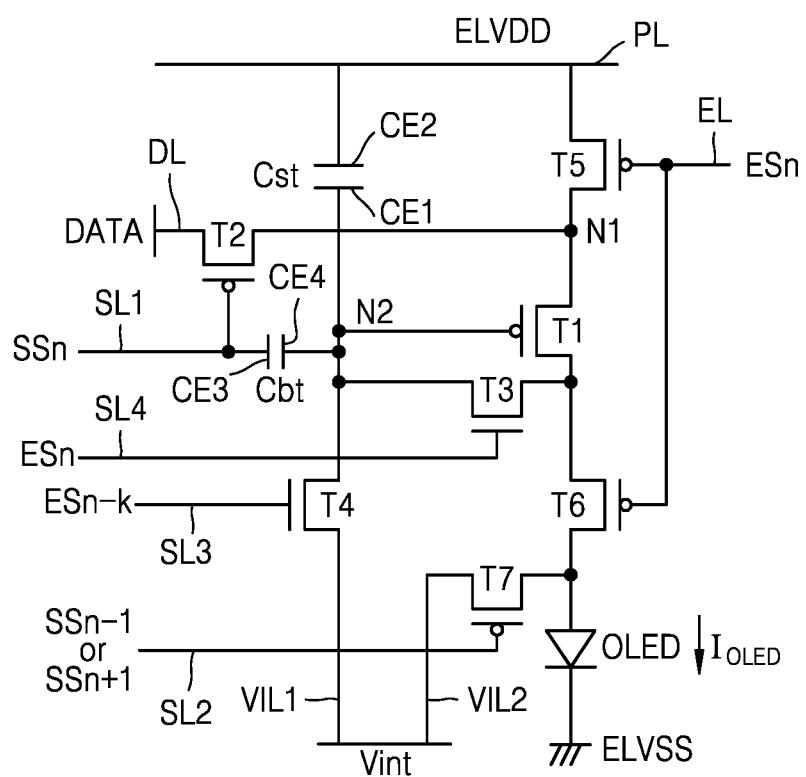
FIG. 13 is an equivalent pixel circuit diagram according to another embodiment.
Figure 14:
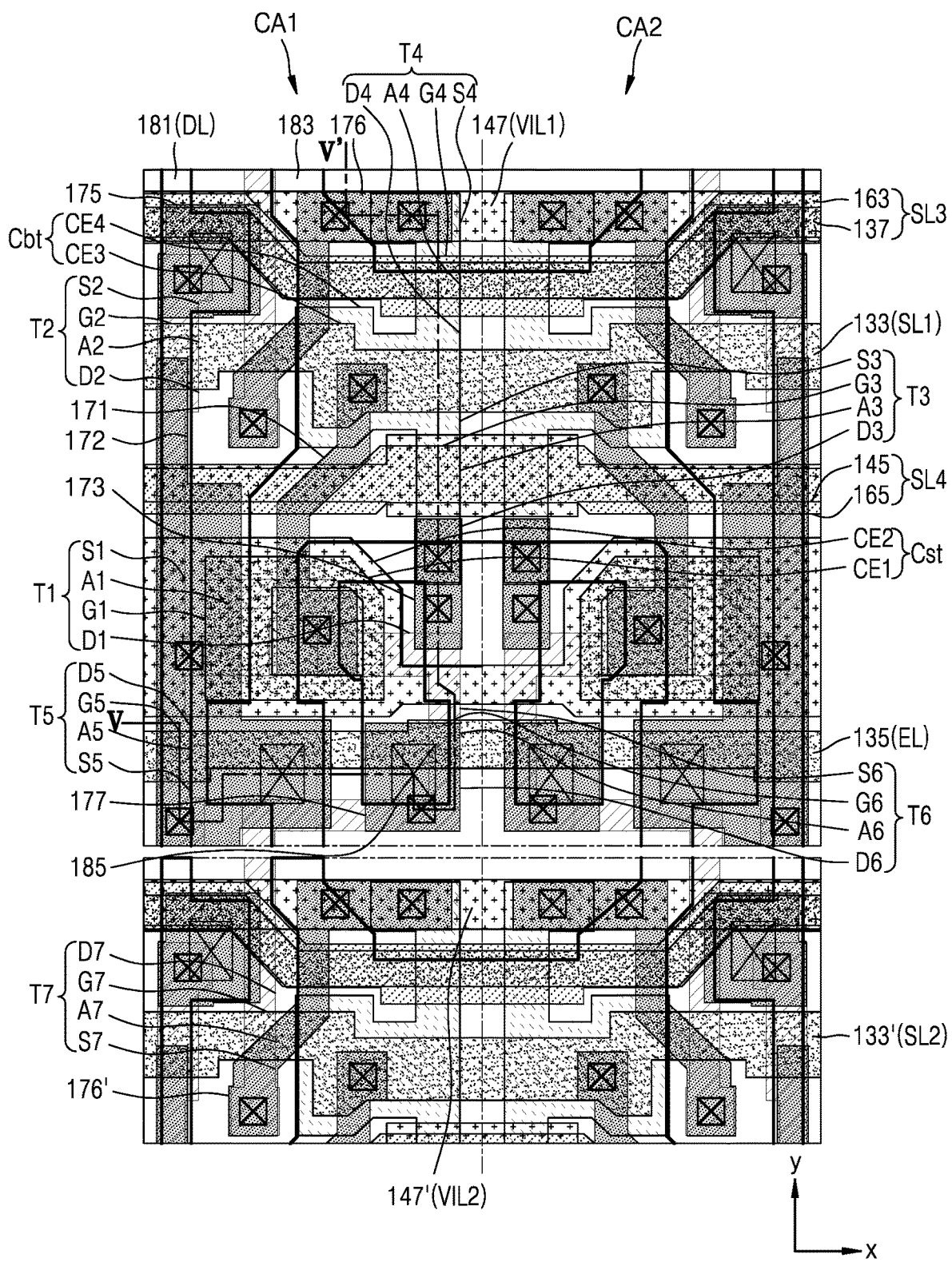
FIG. 14 are schematic diagrams of locations of a plurality of thin film transistors and capacitors arranged on a pair of pixel circuits of a display device according to another embodiment.
Figure 15:
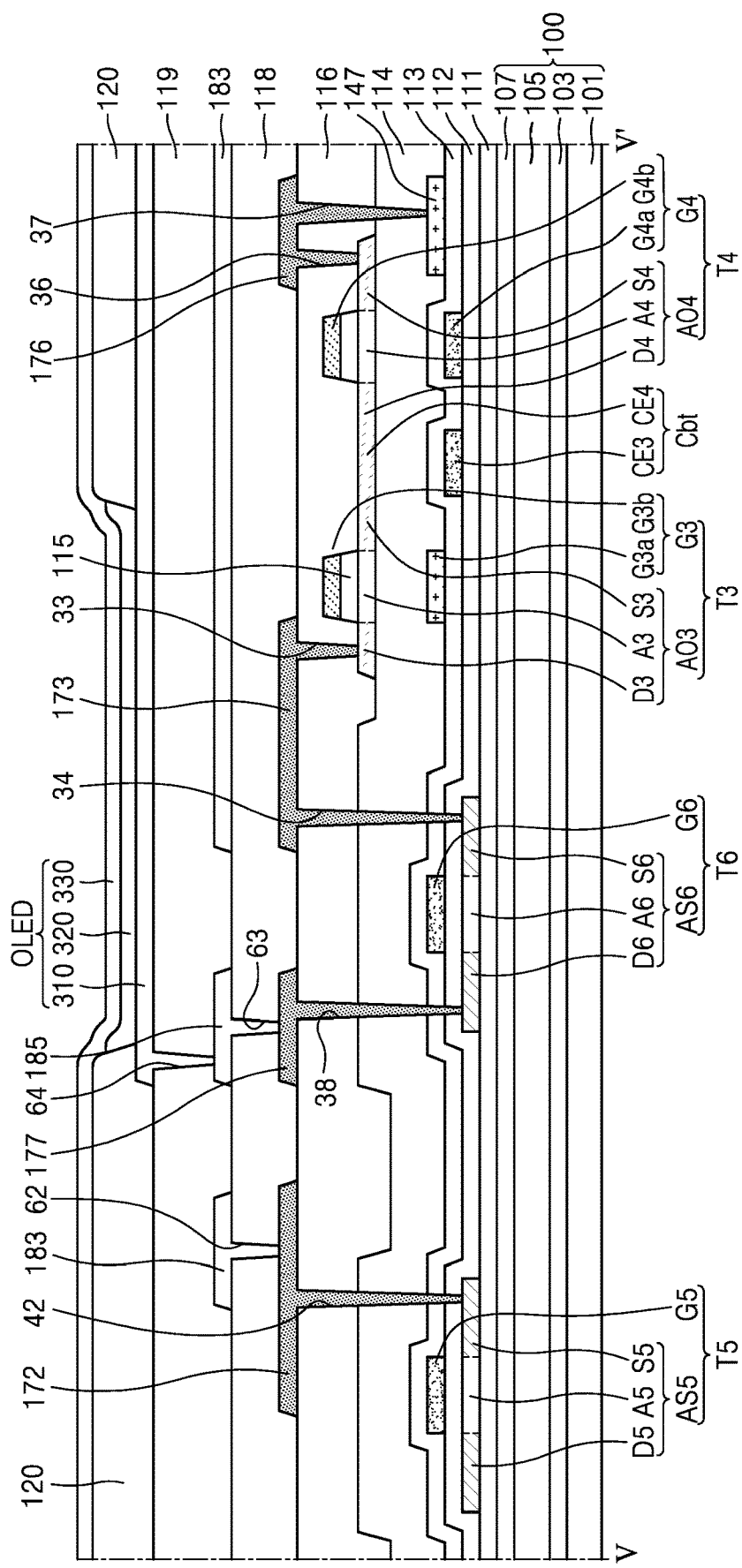
FIG. 15 is a schematic cross-sectional view taken along the line V-V' of FIG. 14.
Figure 16:
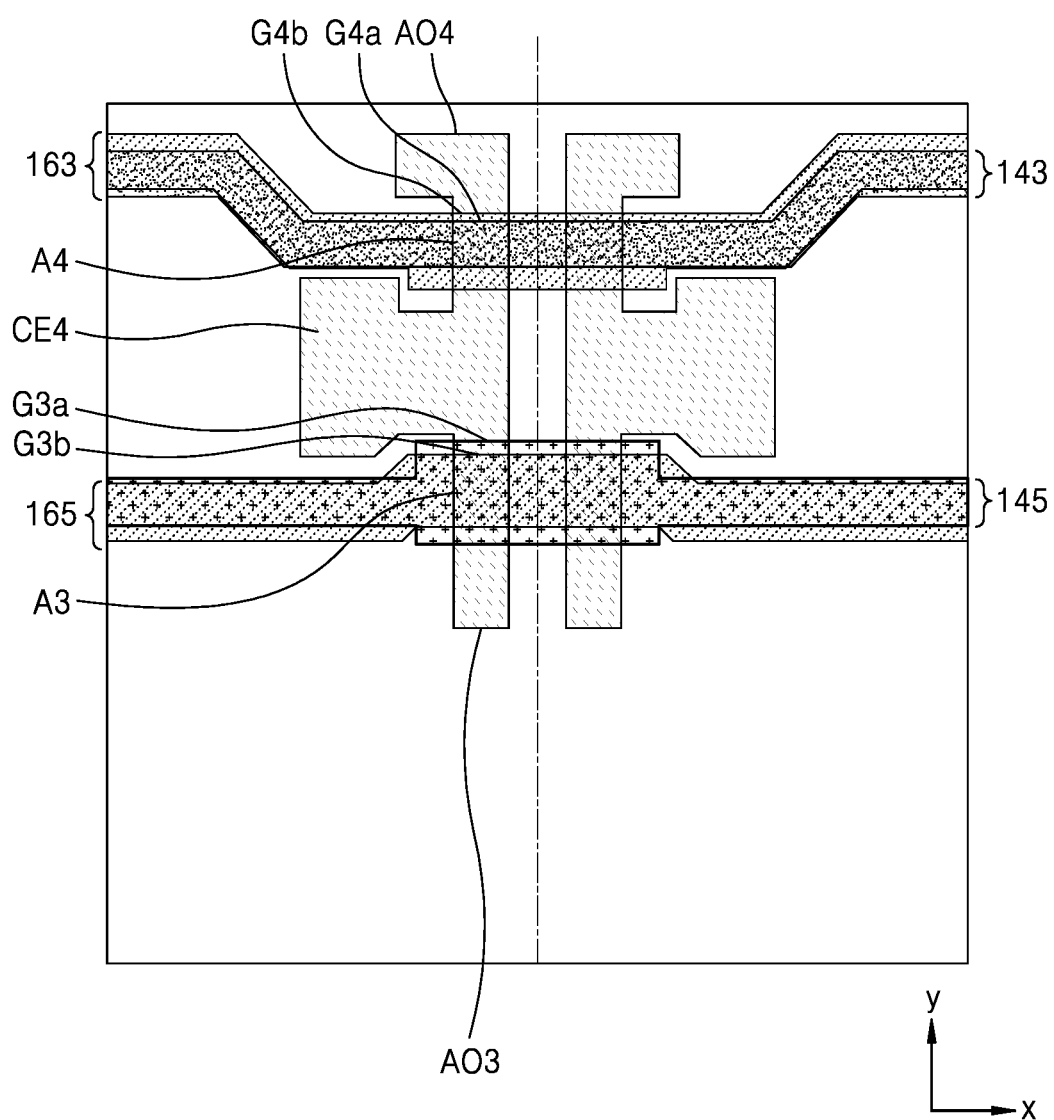
FIGS. 16 and 17 each illustrate layouts of only some elements shown in FIG. 14.
Figure 17:
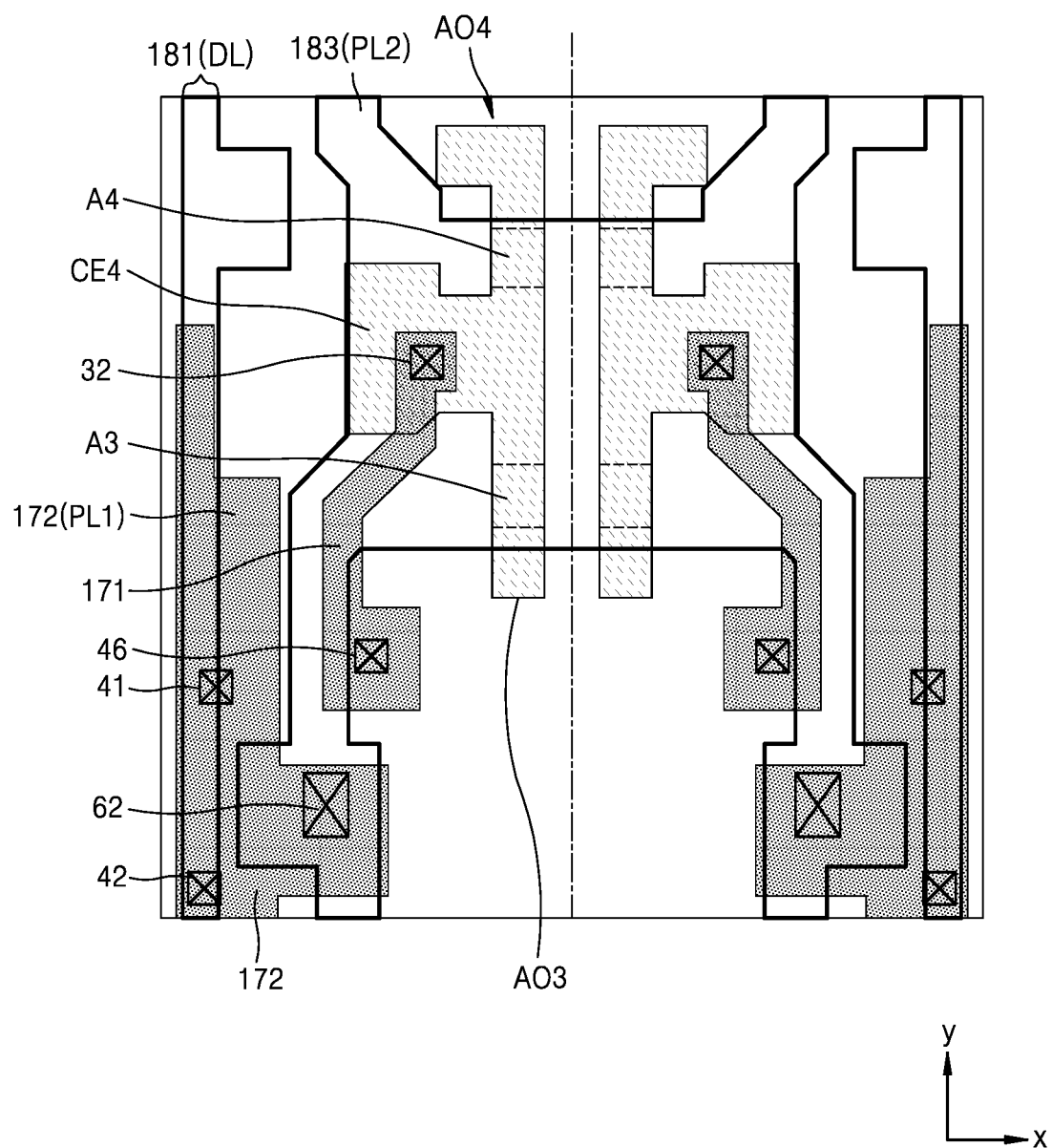

FIG. 13 is an equivalent circuit diagram of a pixel according to another embodiment. FIG. 14 shows schematic diagrams of locations of a plurality of thin film transistors and capacitors arranged on a pair of pixel circuits of a display device according to another embodiment, FIG. 15 is a schematic cross-sectional view taken along the line V-V' of FIG. 14, and FIGS. 16 and 17 each illustrate layouts of only some constituent elements shown in FIG. 14. Descriptions on the same or substantially similar elements as those described above with reference to FIGS. 6 to 12 are omitted for clarity.

The pixel circuit shown in FIG. 13 is different from the pixel circuit shown in FIG. 6, in which the gate electrode of the third transistor T3 is connected to the emission control line EL, in that the gate electrode of the third transistor T3 is connected to a fourth scan line SL4. In the pixel circuit shown in FIG. 13, the fourth scan line SL4 may receive, along with the emission control line EL, the first emission control signal ESn. In an embodiment, the fourth scan line SL4 may be a branch line of the emission control line EL. The timing diagram shown in FIG. 7 may be applied to a driving timing of the pixel circuit shown in FIG. 13.

Referring to FIGS. 14 and 15, the fourth scan line SL4 may extend in the first direction between the first scan line 133 and the emission control line 135.

The semiconductor layers of the third transistor T3 and the fourth transistor T4 may be disposed on the same layer and may include the same material. For example, the semiconductor layer may include an oxide semiconductor.

The third semiconductor layer AO3 of the third transistor T3 may include the third channel region A3, and the third source region S3 and the third drain region D3 at both sides of the third channel region A3. The third source region S3 may be bridge-connected to the first gate electrode G1 via the node connection line 171. Furthermore, the third source region S3 may be connected to the fourth drain region D4 that is disposed on the same layer. The third drain region D3 may be electrically connected to the first semiconductor layer AS1 of the first transistor T1 nd the sixth semiconductor layer AS6 of the sixth transistor T6. The third gate electrode G3 may be a part of the fourth scan line SL4.

The gate electrode of the third transistor T3 may be connected to the fourth scan line SL4, a first electrode thereof is connected to the gate electrode of the first transistor T1, a second electrode thereof is connected to the second electrode of the first transistor T1 and to the OLED via the sixth transistor T6. The third transistor T3 may be turned on by the first emission control signal ESn received via the fourth scan line SL4 to diode-connect the first transistor T1.

The fourth scan line SL4 may include a lower scan line 145 and an upper scan line 165 that are disposed on different layers. The lower scan line 145 may be provided on the same layer and may include the same material as the second electrode CE2 of the first capacitor Cst and the first initialization voltage line 147. The upper scan line 165 may be disposed on the third gate insulating layer 115. The lower scan line 145 may be disposed to at least partially overlap the upper scan line 165. The lower scan line 145 and the upper scan line 165 may correspond to the third gate electrode of the third transistor T3, and the third transistor T3 may have a dual gate structure having a control electrode respectively provided above and below the semiconductor layer. In another embodiment, the fourth scan line SL4 may include only the upper scan line 165 while the lower scan line 145 is omitted, and thus the third transistor T3 may have a single gate structure.

The fourth electrode CE4 of the second capacitor Cbt may be provided on the same layer as the third semiconductor layer AO3 of the third transistor T3 and the fourth semiconductor layer AO4 of the fourth transistor T4 and may be an area between the third semiconductor layer AO3 and the fourth semiconductor layer AO4. In another embodiment, the fourth electrode CE4 may extend from the fourth semiconductor layer AO4. In another embodiment, the fourth electrode CE4 may extend from the third semiconductor layer AO3.

One end of the node connection line 171 may be connected to the first gate electrode G1 via the contact opening 31. The other end of the node connection line 171 may be connected to the fourth electrode CE4 of the second capacitor Cbt, or to the fourth semiconductor layer AO4 or the third semiconductor layer AO3, via the contact opening 32.

According to an embodiment, because the driving circuit for driving the display element includes the first thin film transistor including a silicon semiconductor and the second thin film transistor including an oxide semiconductor, a display device having low power consumption and a high resolution may be provided. According to an embodiment, because the second thin film transistor is driven by using an emission control driving circuit without including a separate scan driving circuit for driving the second thin film transistor, the peripheral area PA may be reduced.

Furthermore, as the data line is vertically apart from (e.g., is vertically separated or spaced apart from) the gate electrode of the first thin film transistor and the node connection line connected thereto by the insulating layers in a multi-layer structure, and another voltage layer is provided between the gate electrode of first thin film transistor and the node connection line connected the gate electrode of first thin film transistor, and the data line, in a direction parallel to the surface of the substrate (in a plane view), a coupling capacitance effect between the gate electrode of the first thin film transistor and the data line may be reduced.

Furthermore, because the pixel circuit includes a boost capacitor, a black gradation may be clearly implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A pixel comprising:
a light-emitting diode;
a first transistor comprising a gate electrode, a first electrode connected to a node, and a second electrode connected to the light-emitting diode and transmitting a driving current to the light-emitting diode;
a second transistor connected between a data line and the node and turned on by a first scan signal;
a third transistor connected between the gate electrode and the second electrode of the first transistor and turned on by a first emission control signal;
a fourth transistor connected between the gate electrode of the first transistor and a first initialization voltage line and turned on by a second emission control signal;
a fifth transistor connected between a driving voltage line and the node and turned on by the first emission control signal; and
a sixth transistor connected between the second electrode of the first transistor and the light-emitting diode and turned on by the first emission control signal,
wherein the first transistor comprises a PMOS transistor, and the third transistor and the fourth transistor each comprises an NMOS transistor, and
wherein a length of the second emission control signal to turn on the fourth transistor is the same as that of the first emission control signal to turn on the third transistor.

2. The pixel of claim 1, wherein the PMOS transistor comprises a silicon semiconductor, and
the NMOS transistors comprise an oxide semiconductor.

3. The pixel of claim 1, further comprising:
a first capacitor connected between the driving voltage line and the gate electrode of the first transistor; and
a second capacitor connected between the gate electrode of the first transistor and a gate electrode of the second transistor.

4. The pixel of claim 1, wherein the second emission control signal is output before the first emission control signal.

5. The pixel of claim 1, further comprising:
a first scan line connected to a gate electrode of the second transistor;
a second scan line connected to a gate electrode of the fourth transistor; and
an emission control line connected to gate electrodes of the third transistor, the fifth transistor, and the sixth transistor.

6. The pixel of claim 1, further comprising:
a first scan line connected to a gate electrode of the second transistor;
a second scan line connected to a gate electrode of the fourth transistor;
a third scan line connected to a gate electrode of the third transistor; and
an emission control line connected to gate electrodes of the fifth transistor and the sixth transistor,
wherein the third scan line is a branch line of the emission control line.

7. The pixel of claim 1, further comprising a seventh transistor connected between the light-emitting diode and a second initialization voltage line and turned on by a second scan signal.

8. The pixel of claim 7, wherein the second scan signal is output before the first scan signal or is output after the first scan signal.

9. The pixel of claim 7, wherein the second transistor, the fifth transistor, the sixth transistor, and the seventh transistor each comprises a PMOS transistor comprising a silicon semiconductor.

10. A display device comprising:
a plurality of pixels;
a scan driving circuit configured to supply scan signals to the plurality of pixels;
an emission control driving circuit configured to supply emission control signals to the plurality of pixels; and
a data driving circuit configured to supply data signals to the plurality of pixels,
wherein each of the plurality of pixels comprises:
a light-emitting diode;
a first transistor comprising a gate electrode, a first electrode connected to a node, and a second electrode connected to the light-emitting diode and transmitting a driving current to the light-emitting diode;
a second transistor connected between a data line and the node and turned on by a first scan signal;
a third transistor connected between the gate electrode and the second electrode of the first transistor and turned on by a first emission control signal;
a fourth transistor connected between the gate electrode of the first transistor and a first initialization voltage line and turned on by a second emission control signal;
a fifth transistor connected between a driving voltage line and the node and turned on by the first emission control signal; and
a sixth transistor connected between the second electrode of the first transistor and the light-emitting diode and turned on by the first emission control signal,
wherein the first transistor comprises a PMOS transistor, and the third transistor and the fourth transistor each comprises an NMOS transistor, and
wherein a length of the second emission control signal to turn on the fourth transistor is the same as that of the first emission control signal to turn on the third transistor.

11. The display device of claim 10, wherein the PMOS transistor comprises a silicon semiconductor, and
the NMOS transistors comprise an oxide semiconductor.

12. The display device of claim 10, wherein each of the plurality of pixels comprises:
a first capacitor connected between the driving voltage line and the gate electrode of the first transistor; and
a second capacitor connected between the gate electrode of the first transistor and a gate electrode of the second transistor.

13. The display device of claim 10, wherein the emission control driving circuit sequentially outputs the emission control signals shifted by an interval, and
the second emission control signal is output before the first emission control signal.

14. The display device of claim 10, wherein each of the plurality of pixels further comprises:
a first scan line connected to a gate electrode of the second transistor;
a second scan line connected to a gate electrode of the fourth transistor; and
an emission control line connected to gate electrodes of the third transistor, the fifth transistor, and the sixth transistor,
wherein the scan driving circuit is connected to the first scan line, and
the emission control driving circuit is connected to the second scan line and the emission control line.

15. The display device of claim 10, wherein each of the plurality of pixels further comprises:
a first scan line connected to a gate electrode of the second transistor;
a second scan line connected to a gate electrode of the fourth transistor;
a third scan line connected to a gate electrode of the third transistor; and
an emission control line connected to gate electrodes of the fifth transistor and the sixth transistor,
wherein the third scan line is a branch line of the emission control line,
the scan driving circuit is connected to the first scan line, and
the emission control driving circuit is connected to the second scan line and the emission control line.

16. The display device of claim 10, wherein each of the plurality of pixels further comprises a seventh transistor connected between the light-emitting diode and a second initialization voltage line and turned on by a second scan signal supplied via a fourth scan line connected to the gate electrode of the seventh transistor.

17. The display device of claim 16, wherein the scan driving circuit sequentially outputs the scan signals shifted by an interval, and
the second scan signal is output before the first scan signal or is output after the first scan signal.

18. The display device of claim 16, wherein the second transistor, the fifth transistor, the sixth transistor, and the seventh transistor each comprises a PMOS transistor comprising a silicon semiconductor.

19. The display device of claim 10, wherein each of the third transistor and the fourth transistor comprises a lower gate electrode and an upper gate electrode.

20. The display device of claim 19, wherein the lower gate electrode of the third transistor and the lower gate electrode of the fourth transistor are on different layers.

\* \* \* \* \*